(12) United States Patent
Shimamoto et al.

(10) Patent No.: US 9,732,426 B2
(45) Date of Patent: Aug. 15, 2017

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Satoshi Shimamoto, Toyama (JP); Yoshiro Hirose, Toyama (JP); Atsushi Sano, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 168 days.

(21) Appl. No.: 14/452,857

(22) Filed: Aug. 6, 2014

(65) Prior Publication Data

US 2015/0044881 A1    Feb. 12, 2015

(30) Foreign Application Priority Data

Aug. 8, 2013   (JP) .................................. 2013-165158

(51) Int. Cl.
*C23C 16/00*    (2006.01)
*C23C 16/455*   (2006.01)
(Continued)

(52) U.S. Cl.
CPC ........ *C23C 16/45553* (2013.01); *C23C 16/36* (2013.01); *C23C 16/401* (2013.01);
(Continued)

(58) Field of Classification Search
CPC . C23C 16/52; C23C 16/45553; C23C 16/325; C23C 16/36
See application file for complete search history.

(56) References Cited

U.S. PATENT DOCUMENTS 8,329,599 B2    12/2012  Fukazawa et al.
2006/0228903 A1  10/2006  McSwiney et al.
(Continued)

FOREIGN PATENT DOCUMENTS

| JP | 01-195277 A | 8/1989 |
| JP | 2011-108737 A | 6/2011 |
| JP | 2011-192875 A | 9/2011 |

OTHER PUBLICATIONS

Japanese Office Action issued Jan. 27, 2017 in the Japanese Application No. 2013-165158.
(Continued)

*Primary Examiner* — Kelly M Gambetta
(74) *Attorney, Agent, or Firm* — Volpe and Koenig, P.C.

(57) ABSTRACT

According to the present disclosure, a film containing carbon added at a high concentration is formed with high controllability. A method of manufacturing a semiconductor device includes forming a film containing silicon, carbon and a predetermined element on a substrate by performing a cycle a predetermined number of times. The predetermined element is one of nitrogen and oxygen. The cycle includes supplying a precursor gas containing at least two silicon atoms per one molecule, carbon and a halogen element and having an Si—C bonding to the substrate, and supplying a modifying gas containing the predetermined element to the substrate.

16 Claims, 10 Drawing Sheets

(51) Int. Cl.
  *H01L 21/02* (2006.01)
  *C23C 16/52* (2006.01)
  *C23C 16/36* (2006.01)
  *C23C 16/40* (2006.01)
  *H01J 37/32* (2006.01)
(52) U.S. Cl.
  CPC .. *C23C 16/45542* (2013.01); *C23C 16/45546* (2013.01); *C23C 16/52* (2013.01); *H01J 37/32449* (2013.01); *H01J 37/32779* (2013.01); *H01L 21/0228* (2013.01); *H01L 21/02126* (2013.01); *H01L 21/02167* (2013.01); *H01L 21/02211* (2013.01); *H01L 21/02274* (2013.01)

(56) References Cited

U.S. PATENT DOCUMENTS

| | | | | |
|---|---|---|---|---|
| 2012/0184110 | A1* | 7/2012 | Hirose | C23C 16/30 438/763 |
| 2013/0084714 | A1* | 4/2013 | Oka | H01L 21/02126 438/765 |
| 2014/0349492 | A1* | 11/2014 | Shimamoto | C23C 16/401 438/786 |
| 2016/0002039 | A1* | 1/2016 | Thompson | C23C 16/308 427/553 |

OTHER PUBLICATIONS

Office Action for Japanese Patent Application No. 2013-165158 dated Nov. 14, 2016.

\* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2013-165158, filed on Aug. 8, 2013, the entire contents of which are incorporated herein by reference.

TECHNICAL FIELD

The present disclosure relates to a method of manufacturing a semiconductor device, a substrate processing apparatus, and a recording medium.

BACKGROUND

As one of processes of manufacturing a semiconductor device, in some cases, a process of forming a thin film such as a silicon nitride film or a silicon oxide film on a substrate may be performed, for example, by supplying a precursor gas containing silicon, a nitriding gas, an oxidizing gas or the like to the substrate.

When the thin film as described above is formed on the substrate, it is possible to improve a resistance to wet etching, for example, by allowing the thin film to contain carbon or the like. At this time, if the carbon can be contained at a high concentration by controlling a concentration of carbon in the thin film with high precision, it is possible to further improve an etching resistance of the film.

SUMMARY

The present disclosure provides some embodiments of a method of manufacturing a semiconductor device, a substrate processing apparatus and a recording medium, which allow a film containing carbon at a high concentration to be formed with high controllability.

According to an aspect of the present disclosure, there is provided a method of manufacturing a semiconductor device, including forming a film containing silicon, carbon and a predetermined element on a substrate by performing a cycle a predetermined number of times, the predetermined element being one of nitrogen and oxygen, the cycle including: supplying a precursor gas containing at least two silicon atoms per one molecule, carbon and a halogen element and having an Si—C bonding to the substrate; and supplying a modifying gas containing the predetermined element to the substrate.

According to another aspect of the present disclosure, there is provided a substrate processing apparatus, including a process chamber configured to accommodate a substrate; a precursor gas supply system configured to supply a precursor gas containing at least two silicon atoms per one molecule, carbon and a halogen element and having an Si—C bonding into the process chamber; a modifying gas supply system configured to supply a modifying gas containing a predetermined element into the process chamber, the predetermined element being one of nitrogen and oxygen; and a controller configured to control the precursor gas supply system and the modifying gas supply system so as to form a film containing silicon, carbon and the predetermined element on the substrate by performing a cycle a predetermined number of times, the cycle including supplying the precursor gas to the substrate in the process chamber and supplying the modifying gas to the substrate in the process chamber.

According to still another aspect of the present disclosure, there is provided a non-transitory computer-readable recording medium storing a program that causes a computer to perform a process of forming a film containing silicon, carbon and a predetermined element on a substrate in a process chamber by performing a cycle a predetermined number of times, the predetermined element being one of nitrogen and oxygen, the cycle including: supplying a precursor gas containing at least two silicon atoms per one molecule, carbon and a halogen element and having an Si—C bonding to the substrate in the process chamber; and supplying a modifying gas containing the predetermined element to the substrate in the process chamber.

DETAILED DESCRIPTION

First Embodiment

Hereinafter, a first embodiment of the present disclosure will be described with reference to the drawings.

(1) Overall Configuration of Substrate Processing Apparatus

Figure 1:
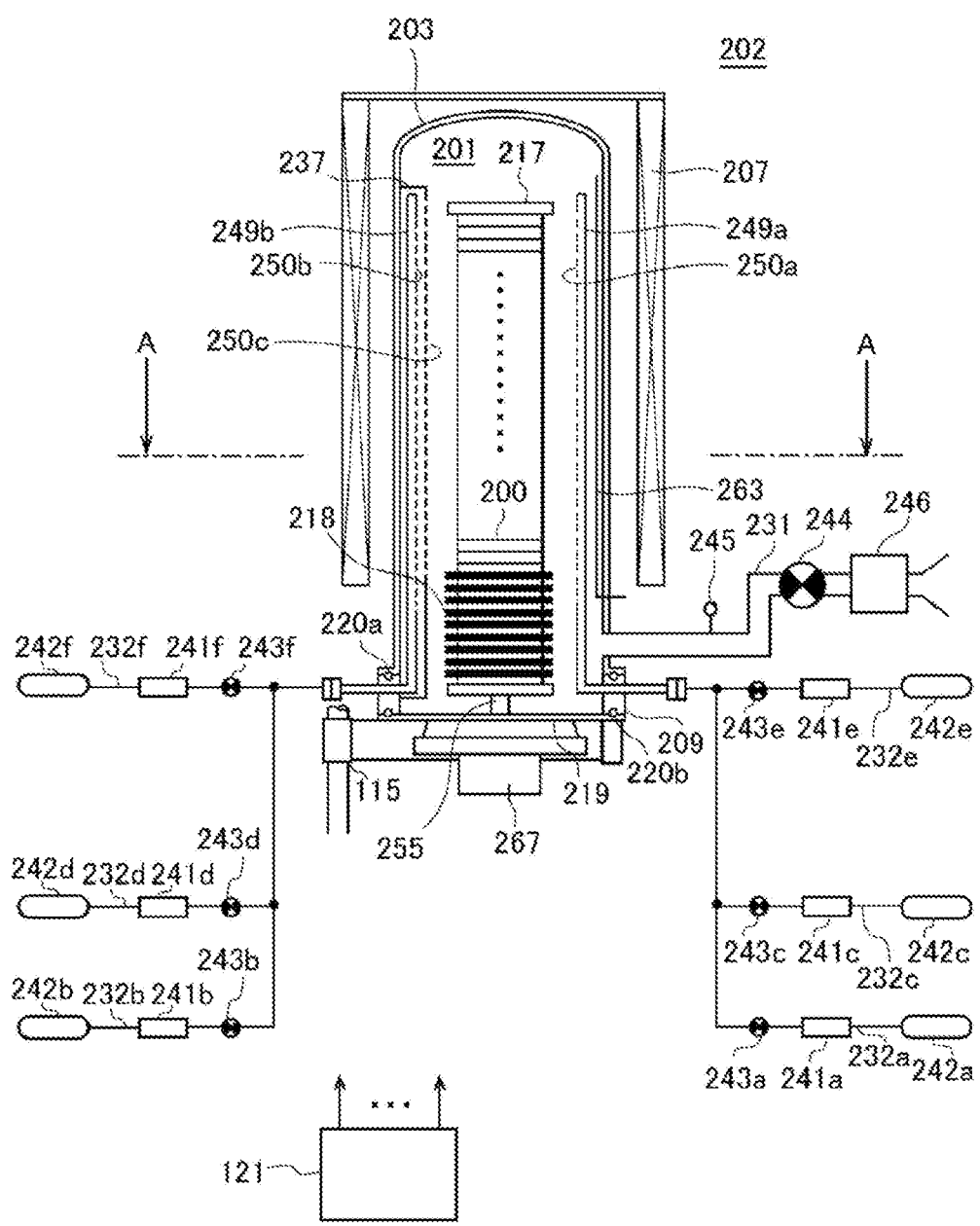
FIG. 1 is a schematic view illustrating a configuration of a vertical processing furnace of a substrate processing apparatus, in which a portion of the processing furnace is shown in a longitudinal sectional view, according to a first embodiment of the present disclosure.

As shown in FIG. 1, the processing furnace 202 includes a heater 207 as a heating unit (heating mechanism). The heater 207 has a cylindrical shape and is supported by a heater base (not shown) as a support plate so as to be vertically installed. In addition, the heater 207 acts as an activating mechanism (exciting unit) to activate (excite) gas by heat, as will be described later.

A reaction tube 203 is disposed inside the heater 207 in a concentric form along the heater 207. The reaction tube 203 is made of a heat resistant material such as quartz ($SiO_2$) or silicon carbide (SiC), and has a cylindrical shape with its upper end closed and its lower end opened. A manifold (inlet flange) 209 is installed under the reaction tube 203 to be concentric with the reaction tube 203. The manifold 209 is made of, for example, metal such as stainless steel, and is formed in a cylindrical shape with its upper and lower ends opened. The upper end of the manifold 209 is caught and coupled to the lower end of the reaction tube 203 and is configured to support the reaction tube 203. An O-ring 220a as a seal member is installed between the manifold 209 and the reaction tube 203. As the manifold 209 is supported by the heater base, the reaction tube 203 is in a vertical installation state. Mostly, a process vessel (reaction vessel) is configured with the reaction tube 203 and the manifold 209. A process chamber 201 is defined in a hollow cylindrical portion of the process vessel. The process chamber 201 is configured to accommodate a plurality of wafers 200 as substrates. The wafers 200 are horizontally stacked in multiple stages to be aligned in a vertical direction in a boat 217, which will be described later.

Nozzles 249a and 249b are installed in the process chamber 201 so as to penetrate through a sidewall of the manifold 209. The nozzles 249a and 249b are respectively connected to gas supply pipes 232a and 232b. A gas supply pipe 232c is connected to the gas supply pipe 232a, and a gas supply pipe 232d is connected to the gas supply pipe 232b. As described above, the two nozzles 249a and 249b and the plurality of gas supply pipes 232a to 232d are installed to the reaction tube 203 so that a plurality of types of gases may be supplied into the process chamber 201.

An $(SiCl_3)_2CH_2$ (BTCSM) gas supply source 242a and a $(CH_3)_2Si_2Cl_4$ (TCDMDS) gas supply source 242c, as precursor gas supply sources, for example, are installed at upstream ends of the gas supply pipes 232a and 232c, respectively. For example, an $NH_3$ gas supply source 242b that is a nitriding gas supply source as a modifying gas supply source and an $O_2$ gas supply source 242d that is an oxidizing gas supply source as a modifying gas supply source are connected to upstream ends of the gas supply pipes 232b and 232d, respectively. For example, $N_2$ gas supply sources 242e and 242f, as inert gas supply sources are connected to upstream ends of gas supply pipes 232e and 232f connected to the gas supply pipes 232a and 232b, respectively. Mass flow controllers (MFCs) 241a to 241f, which are flow rate controllers (flow rate control parts), and valves 243a to 243f, which are opening/closing valves, are installed in the gas supply pipes 232a to 232f in this order from upstream directions, respectively. In addition, the gas supply sources 242a to 242f are connected to the gas supply pipes 232a to 232f, respectively. A downstream end of the gas supply pipe 232c is connected to a downstream side of the valve 243a of the gas supply pipe 232a, and a downstream end of the gas supply pipe 232e is also connected to the downstream side thereof. A downstream end of the gas supply pipe 232d is connected to a downstream side of the valve 243b of the gas supply pipe 232b, and a downstream end of the gas supply pipe 232f is also connected to the downstream side thereof.

Figure 2:
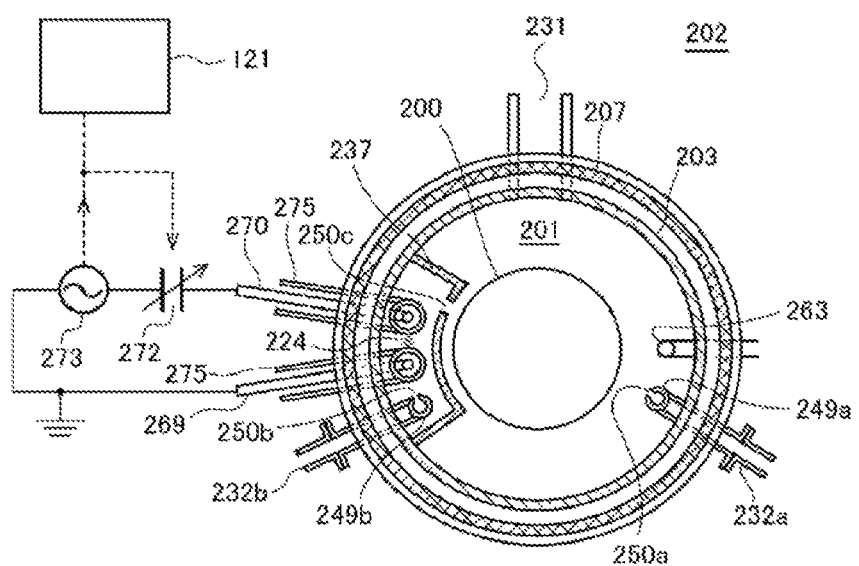
FIG. 2 is a schematic view illustrating a configuration of the vertical processing furnace of the substrate processing apparatus, in which a portion of the processing furnace is shown in a sectional view taken along line A-A in FIG. 1, according to the first embodiment of the present disclosure.

The above-described nozzle 249a is connected to a leading end portion of the gas supply pipe 232a. As shown in FIG. 2, the nozzle 249a is installed in a circular annular space between an inner wall of the reaction tube 203 and the wafers 200. The nozzle 249a is vertically disposed along the inner wall of the reaction tube 203 to rise upward in a stacking direction of the wafers 200. That is, the nozzle 249a is installed at a side of a wafer arrangement region, in which the wafers 200 are arranged so as to horizontally surround the wafer arrangement region. The nozzle 249a is configured as an L-shaped long nozzle, and has its horizontal portion installed to penetrate through the sidewall of the manifold 209 and its vertical portion installed to rise from one end portion of the wafer arrangement region toward the other end portion thereof. A plurality of gas supply holes 250a through which gas is supplied is formed in a side surface of the nozzle 249a. As shown in FIG. 2, the gas supply holes 250a are opened toward a center of the reaction tube 203 to supply gas toward the wafers 200. The gas supply holes 250a are formed in a plural number from a lower portion to an upper portion of the reaction tube 203. The gas supply holes 250a have the same opening area and are formed at an equal pitch.

The above-described nozzle 249b is connected to a leading end portion of the gas supply pipe 232b. The nozzle 249b is installed inside a buffer chamber 237 that is a gas diffusion space. As shown in FIG. 2, the buffer chamber 237 is installed in an annular space between the inner wall of the reaction tube 203 and the wafers 200. The buffer chamber 237 is vertically disposed along the inner wall of the reaction tube 203 in the stacking direction of the wafers 200. That is, the buffer chamber 237 is installed at the side of the wafer arrangement region, in which the wafers 200 are arranged so as to horizontally surround the wafer arrangement region. A plurality of gas supply holes 250c through which gas is supplied is formed in an end of a wall of the buffer chamber 237 adjacent to the wafers 200. The gas supply holes 250c are opened toward the center of the reaction tube 203 to supply gas toward the wafers 200. The gas supply holes 250c are disposed in a plural number from the lower portion to the upper portion of the reaction tube 203. The gas supply holes 250c have the same opening area and are formed at the same opening pitch.

As shown in FIG. 2, the nozzle 249b is installed along the inner wall of the reaction tube 203 to rise upward in the stacking direction of the wafers 200 in an end portion of the buffer chamber 237 opposite to the end portion thereof in which the gas supply holes 250c are formed. That is, the nozzle 249b is installed at the side of the wafer arrangement region, in which the wafers 200 are arranged so as to horizontally surround the wafer arrangement region. The nozzle 249b is configured as an L-shaped long nozzle and has its horizontal portion installed to penetrate through the sidewall of the manifold 209 and its vertical portion installed to rise from one end portion of the wafer arrangement region toward the other end thereof. A plurality of gas supply holes 250b through which gas is supplied is formed in a side surface of the nozzle 249b. As shown in FIG. 2, the gas supply holes 250b are opened toward the center of the buffer chamber 237. The gas supply holes 250b are formed in a plural number from the lower portion to the upper portion of the reaction tube 203 in the same way as the gas supply holes 250c of the buffer chamber 237. The plurality of gas supply holes 250b may have the same opening area and the same opening pitch from an upstream side (lower portion) of the reaction tube 203 to an downstream side (upper portion) of the reaction tube 203 when a pressure difference between the interior of the buffer chamber 237 and the interior of the process chamber 201 is small. However, when the pressure difference is large, the opening area of each gas supply hole 250b may be set larger and the opening pitch of each gas supply hole 250b may be set smaller at the downstream side than the upstream side of the reaction tube 203.

In the embodiment, by adjusting the opening area or opening pitch of each gas supply hole 250b from the upstream side to the downstream side as described above, gases may be ejected at an almost same flow rate from the respective gas supply holes 250b despite a flow velocity difference. In addition, the gases ejected from the respective gas supply holes 250b are first introduced into the buffer chamber 237, and flow velocities of the gases become uniform in the buffer chamber 237. That is, the gases ejected from the respective gas supply holes 250b into the buffer chamber 237 are mitigated in particle velocity of the respective gases in the buffer chamber 237, and then are ejected from the respective gas supply holes 250c into the process chamber 201. Therefore, the gases ejected from the respective gas supply holes 250b into the buffer chamber 237 have a uniform flow rate and flow velocity when the gases are ejected from the respective gas supply holes 250c into the process chamber 201.

In the method of supplying gas using the long nozzle according to the embodiment, the gas may be transferred through the nozzles 249a and 249b and the buffer chamber 237 disposed in a circular annular longitudinally extending space, i.e., a cylindrical shape, defined by the inner wall of the reaction tube 203 and end portions of the stacked wafers 200. The gas is first ejected into the reaction tube 203 near the wafers 200 through the gas supply holes 250a to 250c opened in the nozzles 249a and 249b and the buffer chamber 237, respectively. Thus, a main flow of the gas in the reaction tube 203 follows a direction parallel to surfaces of the wafers 200, i.e., the horizontal direction. With this configuration, the gas can be uniformly supplied to the respective wafers 200, and thus, a film thickness of a film formed on a surface of each wafer 200 can be uniform. A residual gas after the reaction flows toward an exhaust port, i.e., an exhaust pipe 231, but a flow direction of the residual gas is not limited to the vertical direction but may be appropriately adjusted according to a position of the exhaust port.

A chlorosilane-based precursor gas containing a methylene group, for example, which is a precursor gas containing Si, a methylene group as an alkylene group and a chloro group as a halogen group, as a precursor gas containing at least two silicon (Si) atoms per one molecule, carbon (C) and a halogen element (fluorine (F), chlorine (Cl), bromine (Br) or the like) and having an Si—C bonding, is supplied from the gas supply pipe 232a into the process chamber 201 through the MFC 241a, the valve 243a and the nozzle 249a. The chlorosilane-based precursor gas containing a methylene group is a silane-based precursor gas containing a methylene group and a chloro group, or a precursor gas at least containing Si, a methylene group containing C, and Cl as a halogen element. The chlorosilane-based precursor gas containing a methylene group may be referred to as a precursor gas which becomes a silicon (Si) source and a carbon (C) source. As this type of a precursor gas is used, as will be described later, a silicon-based thin film is formed, and it is also possible to introduce C into the thin film, which is being formed, at a high concentration. In addition, as the chlorosilane-based precursor gas containing a methylene group contains at least two Si atoms per one molecule, a denser thin film can be formed as will be described later. The chlorosilane-based precursor gas containing a methylene group supplied from the gas supply pipe 232a may include, for example, methylenebis(trichlorosilane) gas, i.e., bis(trichlorosilyl)methane ($(SiCl_3)_2CH_2$, abbreviation: BTCSM) gas.

Figure 10A:
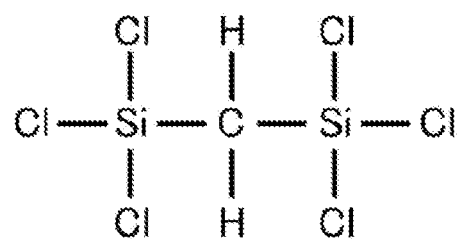
FIGS. 10A to 10E are views illustrating chemical structural formulae of a variety of silanes used as a precursor gas, illustrating chemical structural formulae of BTCSM, BTCSE, TCDMDS, DCTMDS, and MCPMDS, respectively.

As shown in FIG. 10A, the BTCSM contains a methylene group as an alkylene group in its chemical structural formula (In one molecule). The methylene group contained in the BTCSM has two bonding electrons each bonded to Si to form an Si—C—Si bonding. The Si—C bonding contained in the precursor gas is a part of the Si—C—Si bonding, for example, contained in the BTCSM, and the methylene group contained in the BTCSM contains C constituting the Si—C bonding.

Also, the precursor gas containing at least two Si atoms per one molecule, C and a halogen element and having an Si—C bonding includes, for example, a chlorosilane-based precursor gas containing an ethylene group, which is a precursor gas containing Si, an ethylene group as an alkylene group, and a chloro group as a halogen group. The chlorosilane-based precursor gas containing an ethylene group may include, for example, ethylenebis(trichlorosilane) gas, i.e., 1,2-bis(trichlorosilyl)ethane ($(SiCl_3)_2C_2H_4$, abbreviation: BTCSE) gas or the like.

Figure 10B:
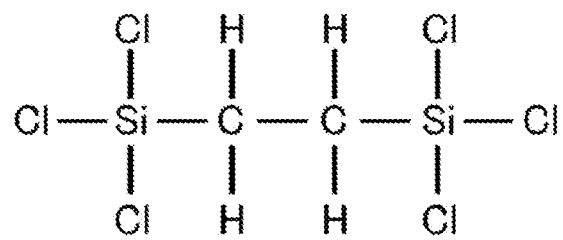

As shown in FIG. 10B, the BTCSE contains an ethylene group as an alkylene group in its chemical structural formula (In one molecule). The ethylene group contained in the BTCSE has two bonding electrons each bonded to Si to form an Si—C—C—Si bonding. The Si—C bonding contained in the precursor gas is a part of the Si—C—C—Si bonding, for example, contained in the BTCSE, and the ethylene group contained in the BTCSE contains C constituting the Si—C bonding.

In addition, the alkylene group is a functional group in which two hydrogen (H) atoms are removed from a chain-like saturated hydrocarbon (alkane) represented by a chemical formula $C_nH_{2n+2}$, and is an assembly of atoms represented by a chemical formula $C_nH_{2n}$. The alkylene group includes a propylene group, a butylene group, or the like, in addition to the methylene group or the ethylene group described above as an example. As described above, the precursor gas containing at least two silicon (Si) atoms per one molecule, C and a halogen element and having an Si—C bonding includes an alkylenehalosilane-based precursor gas containing Si, an alkylene group and a halogen element. The alkylenehalosilane-based precursor gas is a halosilane-based precursor gas containing an alkylene group, and may be referred to as a gas having, for example, a structure in which an alkylene group is introduced between bonded Si and Si while many halogen elements are bonded to bonding electrons of Si in the halosilane-based precursor gas. In addition, the precursor gas containing an Si—C bonding may include a later-described precursor gas having an alkyl group added to Si. However, in the above-described molecular structure having C to be interposed between bonded Si and Si, as will be described later, steric hindrance in a reaction of gas molecules can be suppressed to be smaller. The alkylene-halosilane-based precursor gas includes the BTCSM gas, the BTCSE gas, and the like.

A chlorosilane-based precursor gas containing a methyl group, for example, which is a precursor gas containing Si, a methyl group as an alkyl group, and a chloro group as a halogen group, as a precursor gas containing at least two Si atoms per one molecule, C and a halogen element and having an Si—C bonding, is supplied from the gas supply pipe 232c into the process chamber 201 through the MFC 241c, the valve 243c, the gas supply pipe 232a, and the nozzle 249a. The chlorosilane-based precursor gas containing a methyl group is a silane-based precursor gas containing a methyl group and a chloro group, or a precursor gas at least containing Si, a methyl group containing C, and Cl as a halogen element. The chlorosilane-based precursor gas containing a methyl group may be referred to as a precursor gas which becomes a silicon (Si) source and a carbon (C) source. As this type of a precursor gas is used, as will be described later, a silicon-based thin film is formed, and it is also possible to introduce C into the thin film, which is being formed, at a high concentration. In addition, as the chlorosilane-based precursor gas containing a methyl group contains at least two Si atoms per one molecule, a denser thin film can be formed as will be described later. The chlorosilane-based precursor gas containing a methyl group may include, for example, 1,1,2,2-tetrachloro-1,2-dimethyl-disilane (($CH_3$)$_2$Si$_2$Cl$_4$, abbreviation: TCDMDS) gas, 1,2-dichloro-1,1,2,2-tetramethyldisilane (($CH_3$)$_4$Si$_2$Cl$_2$, abbreviation: DCTMDS) gas and 1-monochloro-1,1,2,2,2-pentamethyldisilane (($CH_3$)$_5$Si$_2$Cl, abbreviation: MCPMDS) gas and the like. The chlorosilane-based precursor gas containing a methyl group supplied from the gas supply pipe 232c may include, for example, TCDMDS gas.

Figure 10C:
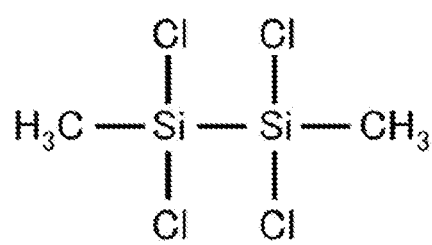

As shown in FIG. 10C, the TCDMDS contains two methyl groups as alkyl groups in its chemical structural formula (In one molecule). The two methyl groups contained in the TCDMDS have bonding electrons each bonded to Si to form an Si—C bonding. The TCDMDS is a derivative of disilane and has an Si—Si bonding. That is, the TCDMDS has an Si—Si—C bonding in which Si and Si are bonded to each other and Si is bonded to C. The Si—C bonding contained in the precursor gas is, for example, a part of the Si—Si—C bonding contained in the TCDMDS, and each of the two methyl groups contained in the TCDMDS contains C constituting the Si—C bonding contained in the precursor gas.

Figure 10D:
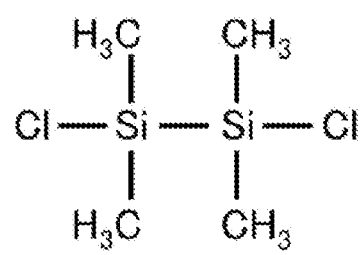

As shown in FIG. 10D, the DCTMDS contains four methyl groups as alkyl groups in its chemical structural formula (In one molecule). The four methyl groups contained in the DCTMDS have bonding electrons each bonded to Si to form an Si—C bonding. The DCTMDS is a derivative of disilane and has an Si—Si bonding. That is, the DCTMDS has an Si—Si—C bonding in which Si and Si are bonded to each other and Si is bonded to C. The Si—C bonding contained in the precursor gas is, for example, a part of the Si—Si—C bonding contained in the DCTMDS, and each of the four methyl groups contained in the DCTMDS contains C constituting the Si—C bonding contained in the precursor gas.

Figure 10E:
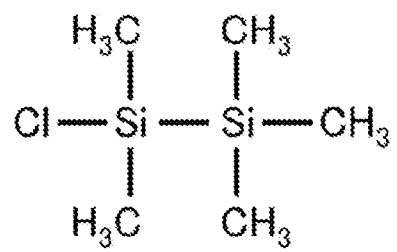

As shown in FIG. 10E, the MCPMDS contains five methyl groups as alkyl groups in its chemical structural formula (In one molecule). The five methyl groups contained in the MCPMDS have bonding electrons each bonded to Si to form an Si—C bonding. The MCPMDS is a derivative of disilane and has an Si—Si bonding. That is, the MCPMDS has an Si—Si—C bonding in which Si and Si are bonded to each other and Si is bonded to C. The Si—C bonding contained in the precursor gas is, for example, a part of the Si—Si—C bonding contained in the MCPMDS, and each of five methyl groups contained in the MCPMDS contains C constituting the Si—C bonding contained in the precursor gas. Contrary to the above-described precursor gases, such as the BTCSM gas, the BTCSE gas, the TCDMDS gas, and the DCTMDS gas, the MCPMDS gas has an asymmetry structure in which the methyl groups and chloro group surrounding Si are asymmetrically arranged in the MCPMDS molecule (in the chemical structural formula). As described above, in the present embodiment, not only a precursor gas having a symmetric chemical structural formula as shown in FIGS. 10A to 10D, but also a precursor gas having an asymmetric chemical structural formula may be used.

In addition, the alkyl group is a functional group in which one H atom is removed from a chain-like saturated hydrocarbon (alkane) represented by a chemical formula $C_nH_{2n+2}$, and is an assembly of atoms represented by a chemical formula $C_nH_{2n+1}$. The alkyl group includes an ethyl group, a propyl group, a butyl group, and the like, in addition to the methyl group exemplified above. As described above, the precursor gas containing at least two Si atoms per one molecule, C and a halogen element and having an Si—C bonding includes an alkylhalosilane-based precursor gas containing Si, an alkyl group and a halogen element. The alkylhalosilane-based precursor gas is a halosilane-based precursor gas containing an alkyl group, and may also be referred to as a gas having a structure in which some halogen groups of a halosilane-based precursor gas are substituted by alkyl groups. Further, if the alkyl group added to Si is a particularly small group like a methyl group, even in case of the precursor gas containing an alkyl group, it may be easy to suppress a reaction hindrance of gas molecules or the like by steric hindrance, as will be described later. The alkylhalosilane-based precursor gas containing such a methyl group includes the TCDMDS gas, the DCTMDS gas, the MCPMDS gas and the like.

Here, the precursor gas refers to a precursor in a gaseous state, for example, a gas obtained by vaporizing a precursor that is a liquid state under normal temperature and pressure, a precursor that is gaseous state under normal temperature and pressure, or the like. When the term "precursor" is used herein, it may refer to "a liquid precursor in a liquid state," "a precursor gas in a gaseous state," or both of them. When a liquid precursor in a liquid state under normal temperature and pressure such as BTCSM, BTCSE, TCDMDS, DCTMDS, or MCPMDS is used, the liquid precursor is vaporized by a vaporization system, such as a vaporizer or a bubbler, and supplied as a precursor gas (BTCSM gas, BTCSE gas, TCDMDS gas, DCTMDS gas, or MCPMDS gas).

As a nitriding gas that is a modifying gas containing a predetermined element that is any one of nitrogen (N) and oxygen (O), for example, a gas containing N (nitrogen-containing gas) as the predetermined element, is supplied from the gas supply pipe 232b into the process chamber 201 through the MFC 241b, the valve 243b, the nozzle 249b, and the buffer chamber 237. The nitriding gas supplied from the gas supply pipe 232b may include, for example, ammonia ($NH_3$) gas.

As an oxidizing gas that is a modifying gas containing a predetermined element that is any one of nitrogen (N) and oxygen (O), for example, a gas containing O (oxygen-containing gas) as the predetermined element, is supplied from the gas supply pipe 232d into the process chamber 201 through the MFC 241*d*, the valve 243*d*, the gas supply pipe 232*b*, the nozzle 249*b*, and the buffer chamber 237. The oxidizing gas supplied from the gas supply pipe 232*d* may include, for example, oxygen ($O_2$) gas.

The nitrogen ($N_2$) gas, for example, as an inert gas, is supplied from the gas supply pipes 232*e* and 232*f* into the process chamber 201 through the MFCs 241*e* and 241*f*, the valves 243*e* and 243*f*, the gas supply pipes 232*a* and 232*b*, the nozzles 249*a* and 249*b*, and the buffer chamber 237, respectively. The $N_2$ gas as the inert gas also acts as a purge gas. The $N_2$ gas as the inert gas supplied from the gas supply pipe 232*f* may also act as an assist gas (ignition gas) for assisting plasma ignition, in some cases.

When the above-described gases flow from the respective gas supply pipes, a precursor gas supply system configured to supply the precursor gas containing at least two Si atoms per one molecule, C and a halogen element and having an Si—C bonding is mainly configured with the gas supply pipes 232*a* and 232*c*, the MFCs 241*a* and 241*c*, and the valves 243*a* and 243*c*. The nozzle 249*a*, the BTCSM gas supply source 242*a*, and the TCDMDS gas supply source 242*c* may also be included in the precursor gas supply system. The precursor gas supply system may be referred to as a precursor supply system. The precursor gas supply system may also be an assembly of a plurality of supply lines (supply system) for respectively supplying a plurality of types of precursor gases having different molecular structures. That is, the precursor gas supply system may refer to an assembly of a BTCSM gas supply line mainly configured with the gas supply pipe 232*a*, the MFC 241*a* and the valve 243*a* and a TCDMDS gas supply line mainly configured with the gas supply pipe 232*c*, the MFC 241*c*, and the valve 243*c*. The nozzle 249*a* or each corresponding precursor gas supply source 242*a* or 242*c* may also be included in each supply line.

In addition, a modifying gas supply system configured to supply the modifying gas containing a predetermined element that is any one of N and O is mainly configured with the gas supply pipes 232*b* and 232*d*, the MFCs 241*b* and 241*d*, and the valves 243*b* and 243*d*. The nozzle 249*b*, the buffer chamber 237, the $NH_3$ gas supply source 242*b*, and the $O_2$ gas supply source 242*d* may also be included in the modifying gas supply system. The modifying gas supply system may be an assembly of a plurality of supply lines (supply system) for respectively supplying a plurality of types of modifying gases containing different predetermined elements or a plurality of types of modifying gases having different molecular structures. That is, the modifying gas supply system may refer to an assembly of an $NH_3$ gas supply line mainly configured with the gas supply pipe 232*b*, the MFC 241*b* and the valve 243*b* and an $O_2$ gas supply line mainly configured with the gas supply pipe 232*d*, the MFC 241*d* and the valve 243*d*. The nozzle 249*b*, the buffer chamber 237, or each corresponding modifying gas supply source 242*b* or 242*d* may also be included in each supply line.

As described above, the precursor gas supply system or modifying gas supply system having the plurality of supply lines is configured to respectively supply a plurality of types of precursor gases or modifying gases having different molecular structures. As described above, the respective gases have different molecular structures, i.e., different chemical structural formulae. The respective gases may differ from one another in composition or component. The respective gases having different molecular structures also differ from one another in chemical properties. Thus, as will be described later, by appropriately selecting the type of precursor gas or modifying gas according to a desired film forming process, thin films having a variety of composition ratios and film qualities can be formed with high versatility and high reproducibility in one substrate processing apparatus.

In addition, an inert gas supply system is mainly configured with the gas supply pipes 232*e* and 232*f*, the MFCs 241*e* and 241*f*, and the valves 243*e* and 243*f*. Portions of the gas supply pipes 232*a* and 232*b* in downstream sides of junctions with the gas supply pipes 232*e* and 232*f*, the nozzles 249*a* and 249*b*, the buffer chamber 237, and the $N_2$ gas supply sources 242*e* and 242*f* may also be included in the inert gas supply system. The inert gas supply system also acts as a purge gas supply system. Further, an assist gas supply system is configured with the gas supply pipe 232*f*, the MFC 241*f*, and the valve 243*f*. A portion of the gas supply pipe 232*b* in a downstream side of a junction with the gas supply pipe 232*f*, the nozzle 249*b*, the buffer chamber 237, and the $N_2$ gas supply source 242*f* may also be included in the assist gas supply system.

In the buffer chamber 237, as illustrated in FIG. 2, two rod-shaped electrodes 269 and 270, each of which is made of conductor and has an elongated structure, are disposed to span from the lower portion to the upper portion of the reaction tube 203 in the stacking direction of the wafers 200. Each of the rod-shaped electrodes 269 and 270 is disposed in parallel to the nozzle 249*b*. Each of the rod-shaped electrodes 269 and 270 is covered with and protected by an electrode protection tube 275 from an upper portion to a lower portion thereof. One of the rod-shaped electrodes 269 and 270 is connected to a high-frequency power source 273 via a matcher 272, and the other one is connected to a ground corresponding to a reference electric potential. By supplying (or applying) high-frequency (or RF) power between the rod-shaped electrodes 269 and 270 from the high-frequency power source 273 through the matcher 272, plasma is generated in a plasma generation region 224 between the rod-shaped electrodes 269 and 270. A plasma source serving as a plasma generator (plasma generating part) is mainly configured with the rod-shaped electrodes 269 and 270, and the electrode protection tube 275. The matcher 272 and the high-frequency power source 273 may be included in the plasma source. The plasma source functions as an activating mechanism (or exciting part) that activates (or excites) gas to a plasma state.

The electrode protection tube 275 has a structure in which each of the rod-shaped electrodes 269 and 270 can be inserted into the buffer chamber 237 in a state where each of the rod-shaped electrodes 269 and 270 is isolated from an internal atmosphere of the buffer chamber 237. Here, when an internal oxygen concentration of the electrode protection tube 275 is equal to an oxygen concentration in an ambient air (atmosphere), each of the rod-shaped electrodes 269 and 270 inserted into the electrode protection tubes 275 is oxidized by the heat generated by the heater 207. Therefore, by charging the inside of the electrode protection tube 275 with an inert gas such as the $N_2$ gas, or by purging the inside of the electrode protection tube 275 with an inert gas such as the $N_2$ gas using an inert gas purging mechanism, the internal oxygen concentration of the electrode protection tube 275 decreases, thereby suppressing oxidation of the rod-shaped electrodes 269 and 270.

The exhaust pipe 231 for exhausting an internal atmosphere of the process chamber 201 is installed at the reaction tube 203. A vacuum exhaust device, for example, a vacuum pump 246, is connected to the exhaust pipe 231 via a pressure sensor 245, which is a pressure detector (i.e., pressure detecting part) for detecting an internal pressure of the process chamber 201, and an APC (Auto Pressure Controller) valve 244, which is a pressure adjuster (i.e., pressure adjusting part). The APC valve 244 is configured to perform/stop vacuum exhaust in the process chamber 201 by opening/closing the valve with the vacuum pump 246 actuated, and further to adjust the internal pressure of the process chamber 201 by adjusting a degree of the valve opening based on the pressure information detected by the pressure sensor 245 while operating the vacuum pump 246. An exhaust system is mainly configured with the exhaust pipe 231, the APC valve 244, and the pressure sensor 245. The vacuum pump 246 may be included in the exhaust system. The exhaust pipe 231 is not limited to being installed at the reaction tube 203 and may be installed at the manifold 209 like the nozzles 249a and 249b.

A seal cap 219, which functions as a furnace port cover configured to hermetically seal a lower end opening of the manifold 209, is installed under the manifold 209. The seal cap 219 is configured to contact the lower end portion of the manifold 209 from its bottom in the vertical direction. The seal cap 219, for example, may be formed of metal such as stainless steel and have a disc shape. An O-ring 220b, which is a seal member in contact with the lower end portion of the manifold 209, is installed at an upper surface of the seal cap 219. A rotary mechanism 267 configured to rotate the boat 217 is installed opposite to the process chamber 201 with respect to the seal cap 219. A rotary shaft 255 of the rotary mechanism 267 passes through the seal cap 219 to be connected to the boat 217. The rotary mechanism 267 is configured to rotate the wafers 200 by rotating the boat 217. The seal cap 219 is configured to move vertically by a boat elevator 115, which is an elevation mechanism vertically disposed at the outside of the reaction tube 203. The boat elevator 115 is configured to enable the boat 217 to be loaded into or unloaded from the process chamber 201 by elevating or lowering the seal cap 219. As such, the boat elevator 115 is configured as a transfer device (i.e., transfer mechanism) that transfers the boat 217 and the wafers 200 supported by the boat 217 into and out of the process chamber 201.

The boat 217, which is used as a substrate support, is made of a heat resistant material such as quartz, silicon carbide, or the like and is configured to support the plurality of the wafers 200 horizontally stacked in multiple stages with the centers of the wafers 200 concentrically aligned. Heat insulating plates 218 formed of a heat resistant material such as quartz, silicon carbide, or the like are horizontally supported in multiple stages at a lower portion of the boat 217 and configured such that the heat from the heater 207 cannot be transferred to the seal cap 219. However, instead of the heat insulating plates 218 installed at the lower portion of the boat 217, a heat insulating cylinder consisting of a cylindrical member formed of a heat resistant material such as quartz, silicon carbide, or the like may be installed.

A temperature sensor 263, which is a temperature detector, is installed in the reaction tube 203. Based on temperature information detected by the temperature sensor 263, an electrical conduction state to the heater 207 is adjusted such that the interior of the process chamber 201 has a desired temperature distribution. The temperature sensor 263 is configured in an L-shape similar to the nozzles 249a and 249b and installed along the inner wall of the reaction tube 203.

Figure 3:
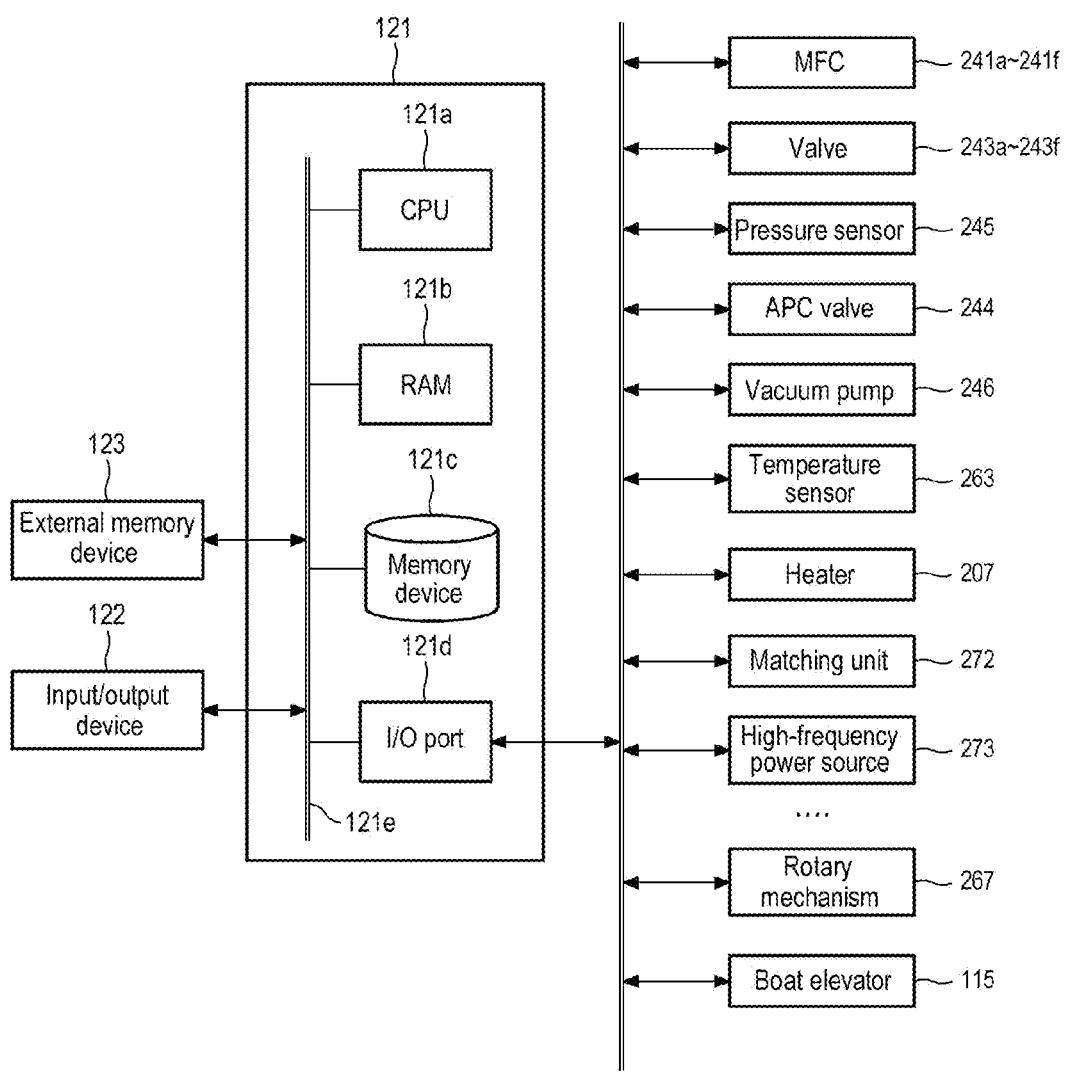
FIG. 3 is a schematic view illustrating a configuration of a controller of the substrate processing apparatus, in which a control system of the controller is shown in a block diagram, according to the first embodiment of the present disclosure.

As illustrated in FIG. 3, a controller 121, which is a control unit (or control part), is configured as a computer including a CPU (Central Processing Unit) 121a, a RAM (Random Access Memory) 121b, a memory device 121c, and an I/O port 121d. The RAM 121b, the memory device 121c and the I/O port 121d are configured to exchange data with the CPU 121a via an internal bus 121e. An input/output device 122, for example, including a touch panel or the like, is connected to the controller 121.

The memory device 121c is configured with, for example, a flash memory, an HDD (Hard Disc Drive), or the like. A control program for controlling operations of the substrate processing apparatus or a process recipe, in which a sequence or condition for processing a substrate, such as for forming a thin film, which will be described later, is written, is readably stored in the memory device 121c. The process recipe functions as a program for the controller 121 to execute each sequence in the substrate processing process, such as a thin film forming process, which will be described later, to obtain a predetermined result. Hereinafter, the process recipe or control program may be generally referred to as a program. When the term "program" is used herein, it may indicate a case including only a process recipe, a case including only a control program, or a case including both a process recipe and a control program. The RAM 121b is configured as a memory area (or work area) in which a program or data read by the CPU 121a is temporarily stored.

The I/O port 121d is connected to the above-described MFCs 241a to 241f, the valves 243a to 243f, the pressure sensor 245, the APC valve 244, the vacuum pump 246, the temperature sensor 263, the heater 207, the matcher 272, the high-frequency power source 273, the rotary mechanism 267, the boat elevator 115 and the like.

The CPU 121a is configured to read and execute the control program from the memory device 121c. According to an input of an operation command from the input/output device 122, the CPU 121a reads the process recipe from the memory device 121c. In addition, the CPU 121a is configured to control the flow rate adjusting operation of various types of gases by the MFCs 241a to 241f, the opening/closing operation of the valves 243a to 243f, the opening/closing operation of the APC valve 244 and the pressure adjusting operation by the APC valve 244 based on the pressure sensor 245, the operation of starting and stopping the vacuum pump 246, the temperature adjusting operation of the heater 207 based on the temperature sensor 263, the rotation and rotation speed adjusting operation of the boat 217 by the rotary mechanism 267, the elevation operation of the boat 217 by the boat elevator 115, the impedance adjusting operation of the matcher 272, the operation of supplying power by the high-frequency power source 273, and the like according to contents of the read process recipe.

The controller 121 is not limited to being configured as a dedicated computer but may be configured as a general-purpose computer. For example, the controller 121 according to the embodiment may be configured by preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program is stored, and installing the program on the general-purpose computer using the external memory device 123. Also, a means for supplying a program to a computer is not limited to the case in which the program is supplied through the external memory device 123. For example, the program may be supplied using a communication means such as the Internet or a dedicated line, rather than through the external memory device 123. The memory device 121c or the external memory device 123 is configured as a non-transitory computer-readable recording medium. Hereinafter, these means for supplying the program will be simply referred to as a recording medium. When the term "recording medium" is used herein, it may include a case in which only the memory device 121c is included, a case in which only the external memory device 123 is included, or a case in which both the memory device 121c and the external memory device 123 are included.

(2) Process of Forming Thin Film

Hereinafter, examples of a sequence of forming a thin film on a substrate, which is one of the processes for manufacturing a semiconductor device by using the processing furnace 202 of the above-described substrate processing apparatus (or device), will be described. In the following description, operations of the respective parts constituting the substrate processing apparatus are controlled by the controller 121.

In the present embodiment, a thin film containing silicon (Si), carbon (C) and a predetermined element, which is any one of nitrogen (N) and oxygen (O), is formed on a wafer 200 as a substrate by performing a cycle a predetermined number of times, the cycle including: a process of supplying a precursor gas containing at least two silicon (Si) atoms per one molecule, carbon (C) and a halogen element and having an Si—C bonding to the wafer 200; and a process of supplying a modifying gas containing the predetermined element to the wafer 200.

Here, the cycle including the respective processes of "the process of supplying the precursor gas" and "the process of supplying the modifying gas" means that each of the processes is performed one or more times in one cycle. Therefore, in one cycle, each process may be performed once, or at least any one of the processes may be performed multiple times. In one cycle, each process may be performed the same number of times or a different number of times. The order of the processes to be performed in the cycle may be arbitrarily determined. In this manner, as the number of times each process is performed, the order of the processes to be performed, a combination thereof, and the like are appropriately changed, thin films having a variety of film qualities, film compositions or component ratios, or the like may be formed. In addition, "performing the cycle a predetermined number of times" means that the cycle is performed once or repeated multiple times. In some examples, the cycle may be repeated multiple times.

For example, in the cycle of the present embodiment, the process of supplying the precursor gas to the wafer 200, and the process of supplying a nitriding gas containing N, as the modifying gas containing the predetermined element, to the wafer 200 are alternately performed.

Also, in the embodiment, the respective processes are performed under a non-plasma atmosphere.

In the present embodiment, in order to form a composition ratio of a thin film to be formed as a stoichiometric composition or another predetermined composition different from the stoichiometric composition, supply conditions of a plurality of types of gases containing a plurality of elements constituting the thin film to be formed are controlled. For example, the supply conditions are controlled such that at least one element of a plurality of elements constituting the thin film to be formed stoichiometrically exceeds another element. Hereinafter, an example of a sequence of forming a film while adjusting a ratio of the plurality of elements constituting the thin film to be formed, i.e., a composition ratio of the thin film, will be described.

Figure 4:
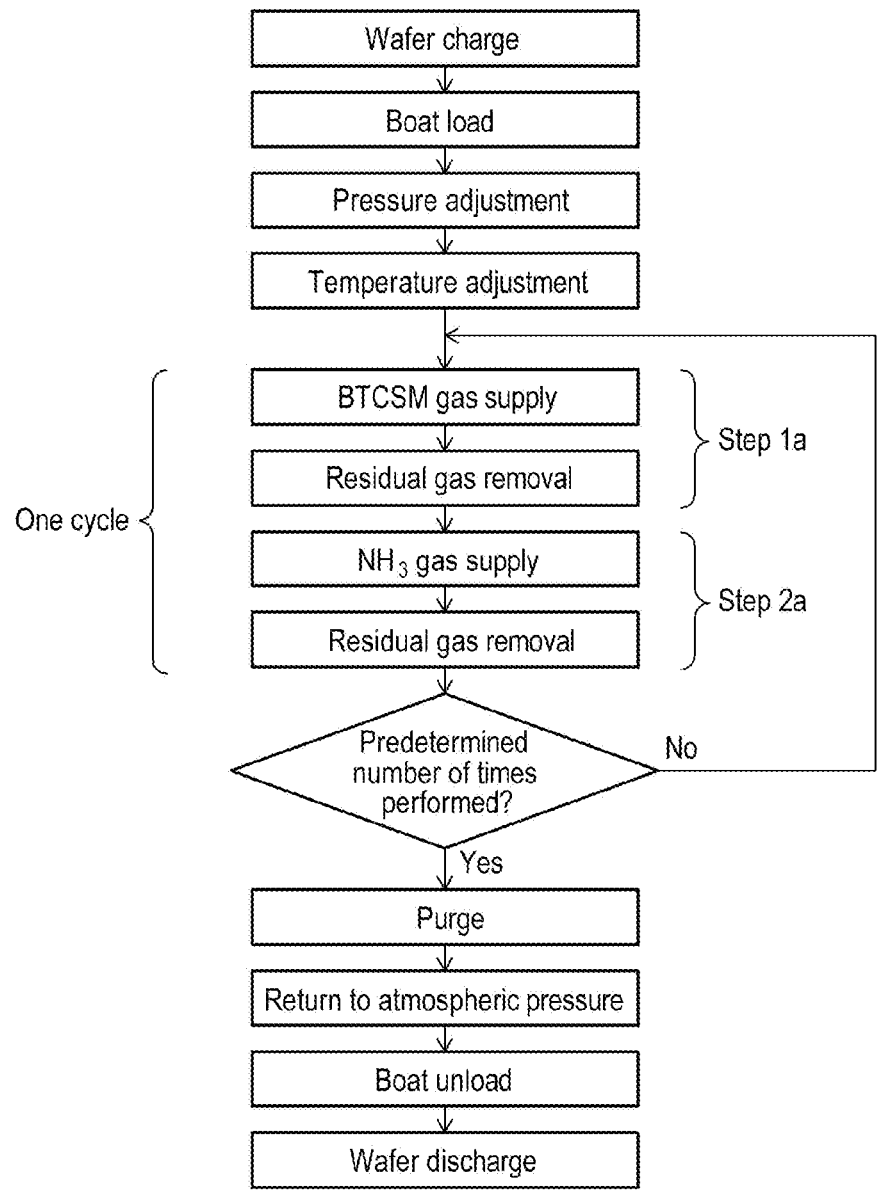
FIG. 4 is a view illustrating a flow of film formation in a film forming sequence according to the first embodiment of the present disclosure.

Hereinafter, the film forming sequence of the present embodiment will be described in detail with reference to FIGS. 4 and 5A.

Here, there will be described an example of forming a silicon carbonitride film (SiCN film) as a thin film containing Si, C and N on the wafer 200 by performing a cycle a predetermined number of times (e.g., n times). In the cycle, a process of supplying a BTCSM gas as the precursor gas to the wafer 200 (Step 1a) and a process of supplying an NH$_3$ gas as the nitriding gas to the wafer 200 (Step 2a) are alternately performed.

In addition, the SiCN film may be referred to as a silicon carbide film (SiC film) doped with N (or having N added), a silicon nitride film (SiN film) doped with C, or the like.

When the term "wafer" is used herein, it may refer to "the wafer itself" or "a stacked body (a collected body) of the wafer and predetermined layers or films formed on the surface of the wafer," i.e., the wafer including the predetermined layers or films formed on the surface may be referred to as a wafer. In addition, the phrase "a surface of a wafer" as used herein may refer to "a surface (an exposed surface) of a wafer itself" or "a surface of a predetermined layer or film formed on the wafer, i.e., the uppermost surface of the wafer, which is a stacked body."

As used herein, the phrase "a predetermined gas is supplied to a wafer" may mean that "a predetermined gas is directly supplied to a surface (an exposed surface) of a wafer itself" or that "a predetermined gas is supplied to a layer or a film formed on a wafer, i.e., on the uppermost surface of a wafer as a stacked body." Also, "a predetermined layer (or film) is formed on a wafer" may mean that "a predetermined layer (or film) is directly formed on a surface (an exposed surface) of a wafer itself" or that "a predetermined layer (or film) is formed on a layer or a film formed on a wafer, i.e., on the uppermost surface of a wafer as a stacked body."

Moreover, the term "substrate" as used herein may be synonymous with the term "wafer," and in this case, the terms "wafer" and "substrate" may be used interchangeably in the above description.

(Wafer Charging and Boat Loading)

When the plurality of wafers 200 is charged on the boat 217 (wafer charging), as illustrated in FIG. 1, the boat 217 supporting the plurality of wafers 200 is raised by the boat elevator 115 to be loaded into the process chamber 201 (boat loading). In this state, the seal cap 219 seals the lower end of the manifold 209 via the O-ring 220b.

(Pressure Adjustment and Temperature Adjustment)

The interior of the process chamber 201 is vacuum exhausted by the vacuum pump 246 to a desired pressure (vacuum level). Here, the internal pressure of the process chamber 201 is measured by the pressure sensor 245, and the APC valve 244 is feedback-controlled based on the measured pressure information (pressure adjustment). The vacuum pump 246 maintains a regular operation state at least until processing of the wafers 200 is terminated. Further, the wafers 200 in the process chamber 201 are heated by the heater 207 to a desired temperature. Here, an electrical conduction state to the heater 207 is feedback-controlled based on the temperature information detected by the temperature sensor 263 until the inside of the process chamber 201 reaches a desired temperature distribution (temperature adjustment). In addition, the heating of the interior of the process chamber 201 by the heater 207 is continuously performed at least until processing of the wafers 200 is terminated. Here, as will be described later, when the wafers 200 are processed at room temperature, the inside of the process chamber 201 may not be heated by the heater 207. Next, the boat 217 and wafers 200 begin to be rotated by the rotary mechanism 267. Furthermore, the rotation of the boat 217 and wafers 200 by the rotary mechanism 267 is continuously performed at least until processing of the wafers 200 is terminated.
(Process of Forming SiCN Film)

Thereafter, the following two steps, i.e., Steps 1a and 2a, are sequentially performed.

[Step 1a]

(BTCSM Gas Supply)

The valve 243a is opened to flow the BTCSM gas into the gas supply pipe 232a. The BTCSM gas, a flow rate of which is controlled by the MFC 241a, is supplied into the process chamber 201 through the gas supply holes 250a and exhausted through the exhaust pipe 231. As such, the BTCSM gas is supplied to the wafer 200. At this time, the valve 243e is opened to flow an inert gas such as the $N_2$ gas into the gas supply pipe 232e. The $N_2$ gas, a flow rate of which is controlled by the MFC 241e, is supplied into the process chamber 201 together with the BTCSM gas, and exhausted through the exhaust pipe 231.

In addition, in order to prevent infiltration of the BTCSM gas into the nozzle 249b or the buffer chamber 237, the valve 243f is opened to flow the $N_2$ gas into the gas supply pipe 232f. The $N_2$ gas is supplied into the process chamber 201 through the gas supply pipe 232b, the nozzle 249b, and the buffer chamber 237, and exhausted through the exhaust pipe 231.

In this case, the APC valve 244 is appropriately adjusted to set the internal pressure of the process chamber 201 to fall within a range of, for example, 1 to 13,330 Pa, or specifically, for example, 133 to 2,666 Pa. The supply flow rate of the BTCSM gas controlled by the MFC 241a is set to fall within a range of, for example, 1 to 2,000 sccm, or specifically, for example, 10 to 1,000 sccm. The supply flow rate of the $N_2$ gas controlled by each of the MFCs 241e and 241f is set to fall within a range of, for example, 100 to 10,000 sccm. A time duration of supplying the BTCSM gas to the wafer 200, in other words, a gas supply time (i.e., an irradiation time), is set to fall within a range of, for example, 1 to 100 seconds, or specifically, for example, 5 to 60 seconds.

At this time, a temperature of the heater 207 is set such that a temperature of the wafer 200 falls within a range of, for example, 400 degrees C. or more to 700 degrees C. or less, specifically, for example, 500 degrees C. or more to 700 degrees C. or less. If the temperature of the wafer 200 is less than 400 degrees C., the BTCSM gas is hardly chemisorbed onto the wafer 200. This sometimes makes it impossible to obtain a practical film forming rate. This problem can be solved by increasing the temperature of the wafer 200 to 400 degrees C. or more. The BTCSM gas can be more sufficiently adsorbed onto the wafer 200 by increasing the temperature of the wafer 200 to 500 degrees C. or more, and a more sufficient film forming rate can be obtained. However, when the temperature of the wafer 200 exceeds 700 degrees C., a CVD reaction becomes intense (i.e., a gas phase reaction becomes dominant). Accordingly, the film thickness uniformity may be hard to control and often deteriorated. By setting the temperature of the wafer 200 to 700 degrees C. or less, such deterioration of the film thickness uniformity can be suppressed, and it becomes possible to control the film thickness uniformity. Accordingly, the temperature of the wafer 200 may be set to fall within a range of, for example, 400 degrees C. or more to 700 degrees C. or less, or specifically, for example, 500 degrees C. or more to 700 degrees C. or less.

As the BTCSM gas is supplied to the wafer 200 under the above-described conditions, for example, a silicon-containing layer (i.e., Si-containing layer) containing C and Cl having a thickness of less than one atomic layer to several atomic layers, as a first layer, is formed on the wafer 200 (or a base film of its surface). The Si-containing layer containing C and Cl may be a silicon layer (i.e., Si layer) containing C and Cl, an adsorption layer of the BTCSM gas, or both of these.

Here, the phrase "Si layer containing C and Cl" is a generic name which encompasses a continuous or discontinuous layer that is formed of Si and contains C and Cl, and a silicon thin film (i.e., Si thin film) containing C and Cl that is formed by laminating such layers. The continuous layer formed of Si and containing C and Cl may be referred to as a Si thin film containing C and Cl. In addition, Si constituting the Si layer containing C and Cl includes Si whose bond to C or Cl is completely broken, in addition to Si whose bond to C or Cl is not completely broken.

The adsorption layer of the BTCSM gas may include a discontinuous adsorption layer in which gas molecules of the BTCSM gas are discontinuous, in addition to a continuous adsorption layer in which gas molecules of the BTCSM gas are continuous. That is, the adsorption layer of the BTCSM gas may include an adsorption layer formed of BTCSM molecules and having a thickness of one molecular layer or less. The BTCSM ($(SiCl_3)_2CH_2$) molecules constituting the adsorption layer of the BTCSM gas includes one or more molecules in which a bond between Si and C is partially broken, or one or more molecules in which a bond between Si and Cl is partially broken, in addition to the molecule represented by the chemical structural formula of FIG. 10A. That is, the adsorption layer of the BTCSM gas includes a chemisorption layer of the BTCSM molecules or a physisorption layer of the BTCSM molecules.

Here, a layer having a thickness of less than one atomic layer refers to a discontinuously formed atomic layer, and a layer having a thickness of one atomic layer refers to a continuously formed atomic layer. In addition, a layer having a thickness of less than one molecular layer refers to a discontinuously formed molecular layer, and a layer having a thickness of one molecular layer refers to a continuously formed molecular layer. Also, the Si-containing layer containing C and Cl may include both the Si layer containing C and Cl and the adsorption layer of the BTCSM gas, but, as described above, the Si-containing layer containing C and Cl will be represented as "a one-atomic layer," "a several-atomic layer," or the like.

When the thickness of the Si-containing layer containing C and Cl as the first layer formed on the wafer 200 exceeds several atomic layers, an effect of a modification reaction such as nitridation in Step 2a, which will be described late, is not applied to the entire first layer. In addition, a minimum value of the thickness of the first layer that can be formed on the wafer 200 is less than one atomic layer. Accordingly, the thickness of the first layer may range from less than one atomic layer to several atomic layers. When the thickness of the first layer is set to be one atomic layer or less, i.e., one atomic layer or less than one atomic layer, an effect of the nitriding reaction in Step 2a described later can be relatively increased, and thus a time required for the nitriding reaction in Step 2a can be reduced. A time required for forming the first layer in Step 1a can also be reduced. As a result, a processing time per one cycle can be reduced, and thus, a total processing time can also be reduced. As such, the film forming rate can be increased. As the thickness of the first layer is one atomic layer or less, it may become possible to better control of film thickness uniformity.

Under a condition in which the BTCSM gas is autolyzed (or pyrolyzed), i.e., under a condition in which a pyrolysis reaction of the BTCSM gas occurs, Si is deposited on the wafer 200 to form the Si layer containing C and Cl. Under a condition in which the BTCSM gas is not autolyzed (or pyrolyzed), i.e., under a condition in which a pyrolysis reaction of the BTCSM gas does not occur, the BTCSM gas is adsorbed on the wafer 200 to form the adsorption layer of the BTCSM gas. In addition, a film forming rate when the Si layer containing C and Cl is formed on the wafer 200 may be greater than that when the adsorption layer of the BTCSM gas is formed on the wafer 200.

As described above, C can be introduced into the first layer by using the BTCSM gas having an Si—C bonding as the precursor gas. The BTCSM gas contains two Si atoms in one molecule and the Si atoms in the same gas molecule are close to each other. Thus, it may be easy to obtain a dense first layer having the Si atoms close to each other. A methylene group contained in the BTCSM gas is interposed between bonded Si and Si, and it is difficult to cause a reaction hindrance by steric hindrance when the BTCSM gas reacts. Thus, it is possible to rapidly form the first layer with enhanced solidity. In such a manner, even when the later-described nitridation by an $NH_3$ gas is performed, the rapidity of reaction can be promoted.

(Residual Gas Removal)

After the Si-containing layer containing C and Cl as the first layer is formed on the wafer 200, the valve 243a is closed to stop the process of supplying the BTCSM gas. At this time, while the APC valve 244 of the exhaust pipe 231 is in an open state, the interior of the process chamber 201 is vacuum exhausted by the vacuum pump 246 to remove the residual BTCSM gas remaining in the process chamber 201 which does not react or remains after contributing to the formation of the first layer, from the process chamber 201. In this operation, the process of supplying the $N_2$ gas as an inert gas into the process chamber 201 is maintained by keeping the valves 243e and 243f in an open state. The $N_2$ gas acts as a purge gas. Thus, the residual BTCSM gas remaining in the process chamber 201 which does not react or remains after contributing to the formation of the first layer can more effectively be removed from the process chamber 201.

In this case, the gas remaining in the process chamber 201 may not completely be removed, and the interior of the process chamber 201 may not completely be purged. When the gas remaining in the process chamber 201 is very small in amount, there is no adverse effect generated in the following Step 2a. The amount of the $N_2$ gas supplied into the process chamber 201 need not be large, and for example, approximately the same amount of the $N_2$ gas as the volume of the reaction tube 203 (the process chamber 201) may be supplied to perform the purge such that there is no adverse effect generated in Step 2a. As described above, as the interior of the process chamber 201 is not completely purged, the purge time can be reduced, thereby improving the throughput. The consumption of the $N_2$ gas can also be suppressed to a minimal necessity.

The precursor gas containing at least two Si atoms per one molecule, C and a halogen element and having an Si—C bonding may include the BTCSE gas, the TCDMDS gas, the DCTMDS gas, the MCPMDS gas and the like, in addition to the BTCSM gas. The inert gas may include a rare gas such as Ar gas, He gas, Ne gas, Xe gas, and the like, in addition to the $N_2$ gas.

[Step 2a]
($NH_3$ Gas Supply)

After Step 1a is completed and the residual gas in the process chamber 201 is removed, the valve 243b is opened to flow the $NH_3$ gas into the gas supply pipe 232b. A flow rate of the $NH_3$ gas flowing into the buffer chamber 237 is adjusted by the MFC 241b. The flow rate-adjusted $NH_3$ gas is supplied into the buffer chamber 237 through the gas supply holes 250b, supplied into the process chamber 201 through the gas supply holes 250c, and then exhausted through the exhaust pipe 231. In this case, the $NH_3$ gas is supplied to the wafer 200 under a non-plasma atmosphere. At the same time, the valve 243f is opened to flow the $N_2$ gas as the inert gas into the gas supply pipe 232f. The $N_2$ gas, the flow rate of which is controlled by the MFC 241f, is supplied into the process chamber 201 together with the $NH_3$ gas, and exhausted through the exhaust pipe 231.

In addition, in order to prevent infiltration of the $NH_3$ gas into the nozzle 249a, the valve 243e is opened to flow the $N_2$ gas into the gas supply pipe 232e. The $N_2$ gas is supplied into the process chamber 201 through the gas supply pipe 232a and the nozzle 249a, and exhausted through the exhaust pipe 231.

In this case, the APC valve 244 is appropriately controlled to set the internal pressure of the process chamber 201 to fall within a range of, for example, 1 to 13,330 Pa, specifically, for example, in a range of 10 to 1,333 Pa, or more specifically, for example, 10 Pa. Specifically, the APC valve 244 may be opened, for example, fully, to set the internal pressure of the process chamber 201 to a maximum attainable pressure according to a supply flow rate of each gas at that time. A supply flow rate of the $NH_3$ gas controlled by the MFC 241b is set to fall within a range of, for example, 1,000 to 10,000 sccm, or specifically, for example, in a range of 1,000 to 9,000 sccm. A supply flow rate of the $N_2$ gas controlled by each of the MFCs 241e and 241f is set to fall within a range of, for example, 100 to 10,000 sccm. A time duration of a process of supplying the $NH_3$ gas to the wafer 200, in other words, a gas supply time (i.e., an irradiation time), is set to fall within a range of, for example, 1 to 100 seconds, or specifically, for example, in a range of 5 to 60 seconds.

At this time, a temperature of the heater 207 is set such that a temperature of the wafer 200 falls within the same temperature range as when the BTCSM gas is supplied in Step 1a, i.e., a range of, for example, 400 degrees C. or more to 700 degrees C. or less, specifically, for example, 500 degrees C. or more to 700 degrees C. or less. If the temperature of the wafer 200 is less than 400 degrees C., it becomes difficult for the first layer (i.e., Si-containing layer containing C and Cl) formed on the wafer 200 to react with the $NH_3$ gas, such that a practical film forming rate cannot be obtained. This problem can be solved by increasing the temperature of the wafer 200 to 400 degrees C. or more. Since the reaction of the first layer and the $NH_3$ gas can be secured by increasing the temperature of the wafer 200 to 500 degrees C. or more, a more sufficient film forming rate can be obtained. Thus, even in Step 2a, the temperature of the wafer 200 may be set to fall within the same temperature range as when the BTCSM gas is supplied in Step 1a.

The $NH_3$ gas supplied in the process chamber 201 is thermally activated, and exhausted through the exhaust pipe 231. At this time, the thermally activated $NH_3$ gas is supplied to the wafer 200. That is, the thermally activated $NH_3$ gas flows in the process chamber 201 while the BTCSM gas does not flow in the process chamber 201. Thus, the $NH_3$ gas supplied in an activated state onto the wafer 200 reacts with at least a portion of the first layer formed on the wafer 200 in Step 1a without causing a gas phase reaction. Accordingly, the first layer is thermally nitrided under the non-plasma atmosphere to be changed (or modified) into a second layer containing Si, C and N, i.e., a SiCN layer.
(Residual Gas Removal)

Thereafter, the valve 243b is closed to stop the process of supplying the NH$_3$ gas. At this time, while the APC valve 244 of the exhaust pipe 231 is in an open state, the interior of the process chamber 201 is vacuum exhausted by the vacuum pump 246, and the residual NH$_3$ gas remaining in the process chamber 201 which does not react or remains after contributing to the reaction or reaction byproducts are removed from the process chamber 201. In addition, the valves 243e and 243f are in an open state, and the process of supplying the N$_2$ gas as an inert gas into the process chamber 201 is maintained. The N$_2$ gas acts as a purge gas, and thus, the residual NH$_3$ gas remaining in the process chamber 201 which does not react or remains after contributing to the formation of the second layer or reaction byproducts can be more effectively removed from the process chamber 201.

In this case, the gas remaining in the process chamber 201 may not completely be removed, and the interior of the process chamber 201 may not completely be purged. When the gas remaining in the process chamber 201 is very small in amount, there is no adverse effect generated in Step 1a performed thereafter. The amount of the N$_2$ gas supplied into the process chamber 201 need not be large, and for example, approximately the same amount of the N$_2$ gas as the volume of the reaction tube 203 (the process chamber 201) may be supplied to perform the purge such that there is no adverse effect generated in Step 1a. As described above, as the interior of the process chamber 201 is not completely purged, the purge time can be reduced, thereby improving the throughput. The consumption of the N$_2$ gas can also be suppressed to a minimal necessity.

Examples of the nitriding gas may include an inorganic nitriding gas such as a diazene (N$_2$H$_2$) gas, hydrazine (N$_2$H$_4$) gas and N$_3$H$_8$ gas, in addition to the NH$_3$ gas, or an amine-based gas, i.e., an organic nitriding gas, such as triethylamine ((C$_2$H$_5$)$_3$N, abbreviation: TEA) gas, diethylamine ((C$_2$H$_5$)$_2$NH, abbreviation: DEA) gas, monoethylamine ((C$_2$H$_5$)NH$_2$, abbreviation: MEA) gas, trimethylamine ((CH$_3$)$_3$N, abbreviation: TMA) gas and monomethylamine ((CH$_3$)NH$_2$, abbreviation: MMA) gas. Examples of the inert gas may include the various rare gases exemplified above, in addition to the N$_2$ gas.
(Performing Predetermined Number of Times)

The above-described Steps 1a and 2a may be set as one cycle and the cycle may be performed one or more times, i.e., a predetermined number of times (e.g., n times), thereby forming an SiCN film having a predetermined composition and a predetermined film thickness on the wafer 200. The above-described cycle may be repeated a plurality number of times. That is, it is possible that a thickness of the SiCN layer formed per cycle is set to be smaller than a desired film thickness, and the above-described cycle may be repeated a plurality number of times until the desired film thickness is obtained.

In this case, a ratio of element components of the SiCN layer, i.e., a ratio of an Si component, an C component, and a N component, in other words, an Si concentration, an C concentration, and a N concentration, may be finely adjusted by controlling the processing conditions such as the internal pressure of the process chamber 201, the gas supply time or the supply amount of gas in each step, thereby minutely controlling a composition ratio of the SiCN film.

Specifically, for example, by controlling a ratio of a time duration of a process of supplying the NH$_3$ gas to a total time duration of a process of supplying the BTCSM gas and the process of supplying the NH$_3$ gas, a concentration of N or C in the SiCN film can be adjusted. Further, for example, by controlling the supply amount of the NH$_3$ gas in the process of supplying the NH$_3$ gas, for example, a supply flow rate of the NH$_3$ gas, a supply time of the NH$_3$ gas, or both of them, the concentration of N or C in the SiCN film can be adjusted. In addition, as will be described later, for example, by performing the process of supplying the precursor gas two or more times with two or more types of different precursor gases for each process of supplying the NH$_3$ gas, the concentration of C in the SiCN film may be further increased. As such, it is thereby possible to relatively change the concentration of each component in the SiCN film, i.e., the Si concentration, the C concentration, the N concentration or the like, or to change an absolute amount of each component in the SiCN film, such as C or N.

When the cycle is performed a plurality number of times, the phrase "a predetermined gas is supplied to the wafer 200" in each step after at least two cycles may mean that the predetermined gas is supplied to a layer formed on the wafer 200, i.e., an uppermost surface of the wafer 200, which is a laminated body. The phrase "a predetermined layer is formed on the wafer 200" may mean that the predetermined layer is formed on a layer formed on the wafer 200, i.e., an uppermost surface of the wafer 200, which is a laminated body. Also, above-described matters are similar in respective modifications or other embodiments which will be described later.
(Purge and Return to Atmospheric Pressure)

When the SiCN film having the predetermined composition and the predetermined film thickness has been formed, the valves 243e and 243f are opened to supply the N$_2$ gas as the inert gas from the gas supply pipes 232e and 232f into the process chamber 201, respectively, and exhausted through the exhaust pipe 231. The N$_2$ gas acts as a purge gas and the interior of the process chamber 201 is purged with the inert gas, so that the gas remaining in the process chamber 201 or reaction byproducts are removed from the process chamber 201 (i.e., purge). Subsequently, the internal atmosphere in the process chamber 201 is substituted with the inert gas (i.e., inert gas substitution), and the internal pressure of the process chamber 201 returns to normal pressure (i.e., return to atmospheric pressure).
(Boat Unload and Wafer Discharge)

Thereafter, the seal cap 219 is lowered by the boat elevator 115 to open the lower end of the manifold 209, and the processed wafer 200 supported by the boat 217 is unloaded to the outside of the reaction tube 203 through the lower end of the manifold 209 (i.e., boat unload). Then, the processed wafer 200 is discharged from the boat 217 (i.e., wafer discharge).

(3) Effects According to the Present Embodiment

According to the present embodiment, one or more effects may be achieved as described below.

(a) According to the film forming sequence of the present embodiment, in Step 1a of the process of forming the SiCN film, the BTCSM gas is supplied to the wafer 200. As such, as the precursor gas containing at least two Si atoms per one molecule, C and a halogen element and having an Si—C bonding is used, it is possible to form the SiCN layer or SiCN film containing C introduced therein at a high concentration. The SiCN film containing C at a high concentration has a high etching resistance or a low dielectric constant.

As a transistor is miniaturized in size, a thin film used in a sidewall spacer (SWS), which is a surrounding structure of a gate electrode, or a hard mask used in various processing, for example, requires a low wet etching rate to hydrogen fluoride (e.g., HF aqueous solution) or a low dielectric constant of the film. Although a thin film having a high etching resistance and a low dielectric constant is obtained by adding C to the silicon nitride film (e.g., $Si_3N_4$ film, hereinafter, also referred to as an SiN film) or the like, it is difficult to allow the film to contain C at a high concentration or to control a concentration of C in the film with high precision.

In the present embodiment, the BTCSM gas containing two Si atoms per one molecule, a methylene group (C) and Cl and having an Si—C bonding is supplied. As such, in a step of forming the first layer as the initial layer on the wafer 200, since C can be introduced into the first layer, an SiCN film containing C at a high concentration can be formed. It is also possible to control a concentration of C in the SiCN film with high precision. Therefore, for example, it is possible to obtain the SiCN film having a high etching resistance and a low dielectric constant.

(b) According to the film forming sequence of the present embodiment, in Step 1a, a dense SiCN film can be formed by supplying the precursor gas such as the BTCSM gas having the above-described molecular structure to the wafer 200.

When the precursor gas such as the BTCSM gas having the above-described molecular structure is adsorbed onto the wafer 200 (e.g., the base film of the surface), Si atoms contained in at least the same molecule of the precursor gas are adsorbed while being kept close to each other. Even when the Si atoms are deposited on the wafer 200 under a condition in which the precursor gas is autolyzed, the respective Si atoms may be deposited while being kept close to each other. Therefore, when the precursor gas having the above-described molecular structure is used, the first layer having Si atoms close to each other is more easily formed than when a precursor gas not having the above-described molecular structure, such as, having a smaller number of Si atoms per one molecule. With this configuration, a finally obtained SiCN film also becomes a dense film having Si atoms close to each other. Such a dense SiCN film has a more improved etching resistance.

(c) According to the film forming sequence of the present embodiment, in Step 1a, by supplying the precursor gas such as the BTCSM gas having the above-described molecular structure to the wafer 200, a reaction hindrance by steric hindrance is easily suppressed when the precursor gas reacts. Thus, it is possible to rapidly form a SiCN film with enhanced solidity.

In the BTCSM gas or the like, C is introduced into a gas molecule in order to be interposed between bonded Si and Si, and thus, it is difficult for such a C-containing group, i.e., a methylene group, to cause the steric hindrance that hinders a reaction of Si in the gas molecule. That is, when the BTCSM gas is adsorbed onto the wafer 200 (e.g., the base film of the surface), the methylene group in the BTCSM gas molecule hardly causes hindrance, and thus, it is easy for Si in the BTCSM gas molecule to be directly bonded to the wafer 200 (e.g., the base film of the surface). With such configuration, the more rigid first layer can be easily formed, thereby improving a film forming rate. In addition, even if undecomposed or partially decomposed methylene groups remain in the first layer when the first layer is nitrided by the $NH_3$ gas, they hardly hinder N in the $NH_3$ gas from reacting and being bonded with Si in the first layer. Accordingly, the nitridation by the $NH_3$ gas rapidly progresses, which also makes it possible to increase a film forming rate. In addition, even though the number of C in the precursor gas is increased like the BTCSE gas containing an ethylene group, an influence caused by the steric hindrance may be still small.

In the meantime, although the TCDMDS gas or the like has a molecular structure having an alkyl group added to Si, if such an alkyl group is sufficiently small like a methyl group or the like, a reaction hindrance influence caused by the steric hindrance may be very small. That is, for example, since a methyl group included in TCDMDS gas, DCTMDS gas or MCPMDS gas has only one C atom, the methyl group is a smallest substituent among the alkyl groups. For example, a gas molecule structure in which a predetermined Si atom has a methyl group may be compared with a gas molecule structure in which a predetermined Si atom has an ethyl group having higher volume density than the methyl group. In this case, when the number of the groups that the Si atoms have in respective gas molecule structures is assumed to be the same, the steric hindrance subjected to the Si atom having the methyl group is smaller than the steric hindrance subjected to the Si atom having the ethyl group. Thus, a reaction hindrance may hardly occur to the gas molecules having the methyl group.

(d) According to the film forming sequence of the present embodiment, in Step 2a, the $NH_3$ gas is supplied to the wafer 200. With this configuration, an SiCN film having N added to an SiC film can be easily formed.

In a related art, an SiCN film may be formed by the following method. For example, in addition to a process of forming an Si-containing layer using a hexachlorodisilane ($Si_2Cl_6$, abbreviation: HCDS) gas or the like, or a process of nitriding the Si-containing layer by a nitriding gas to form a silicon nitride layer (SiN layer), a process of supplying a TEA gas, a propylene ($C_3H_6$) gas or the like to the wafer 200 under non-plasma conditions or plasma-excited conditions may be provided. With such configuration, C is introduced into the Si-containing layer or the SiN layer, and as a result, an SiCN film can be formed.

In the meantime, in the present embodiment, as the BTCSM gas is used as the precursor gas, C is introduced into the first layer in the step of forming the first layer, as the initial layer, on the wafer 200. Here, as N is added by the $NH_3$ gas or the like, the SiCN film can be easily formed. That is, for example, without using a complicated gas system such as a ternary or quaternary gas system like the above-described related art, the SiCN film can be formed. Therefore, it is possible to simplify a film forming process and also to reduce manufacturing costs since the film forming process is easily established.

(e) According to the film forming sequence of the present embodiment, by adjusting a ratio of a time duration of the process of supplying the $NH_3$ gas to a total time duration of the process of supplying the BTCSM gas and the process of supplying the $NH_3$ gas, a concentration of N or C in the SiCN film can be controlled. That is, if the ratio of a time duration of the process of supplying the $NH_3$ gas to a total time duration of the processes is increased, the concentration of N in the SiCN film can be increased, and accordingly, the concentration of C therein can be decreased since C is easily desorbed from the film. Also, if the ratio of a time duration of the process of supplying the $NH_3$ gas to a total time duration of the processes is decreased, the concentration of N in the SiCN film can be decreased, and accordingly, a decrease in the concentration of C therein can be suppressed since C is hardly desorbed from the film. In this way, it is possible to change a concentration of each component, i.e., the absolute amount of C or N, in the film by adjusting the process of supplying the $NH_3$ gas. In addition, by increasing or decreasing the concentration of N in the film, a concentration of another component in the film, i.e., the Si concentration, the C concentration or the like, may be relatively changed.

(4) Modifications of the Present Embodiment

Next, first to third modifications of the present embodiment will be described with reference to FIGS. 5B to 5D.

Figure 5A:
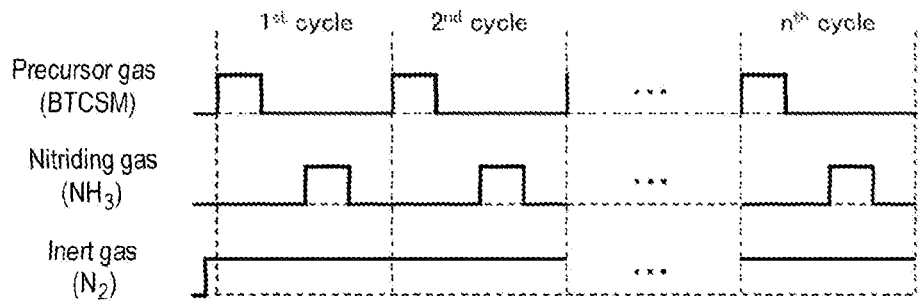
FIG. 5A is a view illustrating gas supply timings in the film forming sequence according to the first embodiment of the present disclosure.

In the cycle of the film forming sequence shown in FIG. 5A, an example in which the respective gases are alternately supplied has been described. In each cycle of film forming sequences of the first to third modifications shown in FIGS. 5B to 5D, examples of performing a process of supplying the precursor gas a predetermined number of times under a condition in which the process of supplying the modifying gas is performed will be described.

Figure 5B:
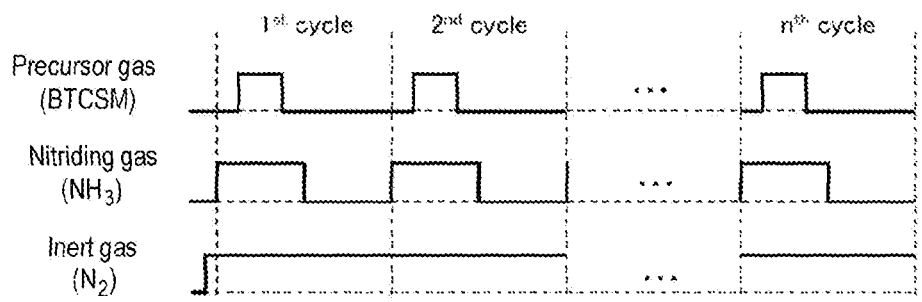
FIGS. 5B to 5D are views illustrating gas supply timings according to first to third modifications thereof.

In the first modification shown in FIG. 5B, a cycle in which the process of supplying the BTCSM gas as the precursor gas is performed once while the process of supplying the $NH_3$ gas as the modifying gas is performed may be performed a predetermined number of times (e.g., n times). That is, in the first modification, the process of supplying the BTCSM gas and the process of supplying the $NH_3$ gas are simultaneously performed, the process of removing a residual gas is then performed, and they are repeated a plurality number of times. At this time, as shown in FIG. 5B, the process of supplying the $NH_3$ gas in each cycle may be initiated prior to the process of supplying the BTCSM gas and terminated posterior thereto. In the first modification, in this way, both the BTCSM gas and the $NH_3$ gas are intermittently supplied. In addition, a cycle in which the process of supplying the BTCSM gas is repeated a plurality number of times while the process of supplying the $NH_3$ gas is performed may be performed a predetermined number of times (e.g., n times).

Figure 5C:
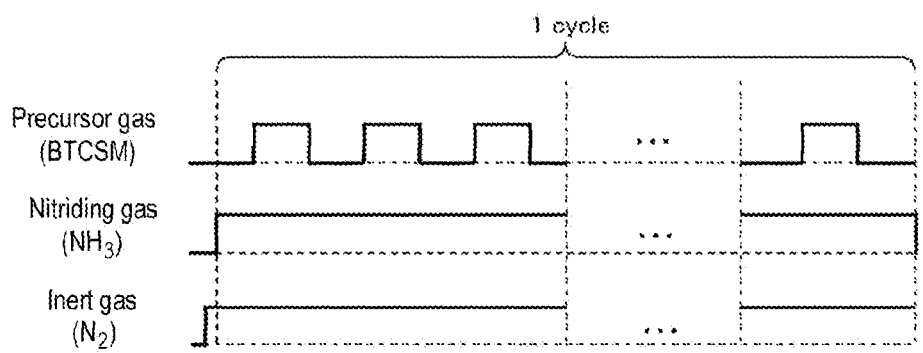

In the second modification shown in FIG. 5C, a cycle in which the process of supplying the BTCSM gas is performed a predetermined number of times while the process of supplying the $NH_3$ gas is performed may be performed, for example, once. That is, in the second modification, while the $NH_3$ gas is continuously supplied, the process of supplying the BTCSM gas is repeated a plurality number of times. Meanwhile, the process of removing a residual gas is not performed. At this time, as shown in FIG. 5C, the first process among the repeated processes of supplying the BTCSM gas may be initiated after the process of supplying the $NH_3$ gas is initiated and the last process among the repeated processes of supplying the BTCSM gas may be terminated before the process of supplying the $NH_3$ gas is stopped. In the second modification, in this way, the BTCSM gas is intermittently supplied, and the $NH_3$ gas is continuously supplied. Further, the cycle in the second modification may be repeated a plurality number of times.

Figure 5D:
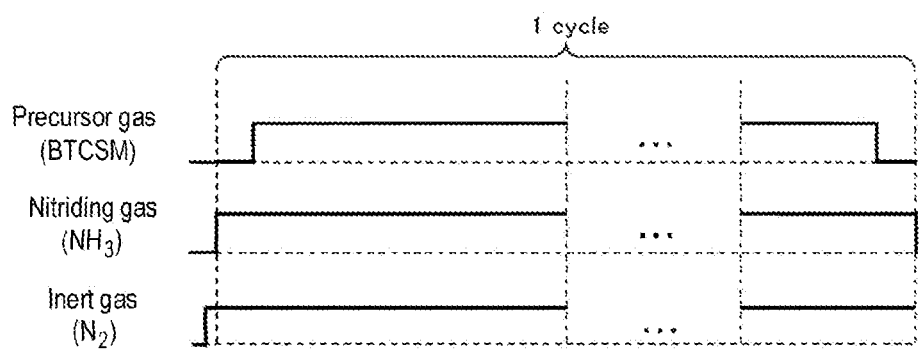

In the third modification shown in FIG. 5D, a cycle in which the process of supplying the BTCSM gas is performed once while the process of supplying the $NH_3$ gas is performed may be performed, for example, once. That is, in the third modification, a process of simultaneously supplying the BTCSM gas and the $NH_3$ gas is performed once. At this time, as shown in FIG. 5D, the process of supplying the $NH_3$ gas may be initiated prior to the process of supplying the BTCSM gas and stopped after the process of supplying of the BTCSM gas. In the third modification, in this way, both the BTCSM gas and the $NH_3$ gas are continuously supplied.

In any one of the first to third modifications, the APC valve 244 is appropriately controlled such that the internal pressure of the process chamber 201 is set to fall within a range, for example, 1 to 500 Pa, or specifically, for example, 10 to 500 Pa. A supply flow rate of the BTCSM gas controlled by the MFC 241a is set to fall within a range, for example, 1 to 2,000 sccm, or specifically, for example, 100 to 1,000 sccm. A supply flow rate of the $NH_3$ gas controlled by the MFC 241b is set to fall within a range of two to ten times the supply flow rate of the BTCSM gas. A supply flow rate of the $NH_3$ gas controlled by each of the MFCs 241e and 241f is set to fall within a range, for example, 100 to 10,000 sccm. Also, at least in the first and second modifications, a time duration of supplying the BTCSM gas to the wafer 200 at a time, in other words, a gas supply time (i.e., an irradiation time), is set to fall within a range of, for example, 1 to 100 seconds, or specifically, for example, 5 to 60 seconds.

Further, in any case of the first to third modifications, a temperature of the heater 207 is set such that a temperature of the wafer 200 causes a gas phase reaction between the BTCSM gas and the $NH_3$ gas to occur. That is, a temperature of the heater 207 is set such that the temperature of the wafer 200 falls within a range of, for example, 500 degrees C. or more to 850 degrees C. or less, or specifically, for example, 700 degrees C. or more to 850 degrees C. or less. If the temperature of the wafer 200 is less than 500 degrees, the reaction between the BTCSM gas and the $NH_3$ gas hardly occurs and thus a film is not formed. This problem can be solved by setting the temperature of the wafer 200 to 500 degrees C. or more, and a film can be formed. However, when the temperature of the wafer 200 is less than 700 degrees C., for example, 680 degrees C. or less, the reaction between the BTCSM gas and the $NH_3$ gas may hardly occur as ever, in some cases. The BTCSM gas and the $NH_3$ gas can more securely react by setting the temperature of the wafer 200 to 700 degrees C. or more to cause a more appropriate gas phase reaction. In addition, if the temperature of the wafer 200 exceeds 850 degrees C., the gas phase reaction may be excessive. Accordingly, the film thickness uniformity may be easily deteriorated, making it difficult to control the film thickness uniformity. By setting the temperature of the wafer 200 to 850 degrees C. or less, the deterioration of the film thickness uniformity can be suppressed, and it is possible to control the film thickness uniformity. Accordingly, the temperature of the wafer 200 may be set to fall within a range of, for example, 500 degrees C. or more to 850 degrees C. or less, or specifically, for example, 700 degrees C. or more to 850 degrees C. or less.

As both the BTCSM gas and the $NH_3$ gas are supplied to the wafer 200 under the above-described conditions, the reaction for forming the Si-containing layer containing C and Cl (i.e., the first layer) and the reaction for thermally nitriding the first layer under non-plasma conditions to form the SiCN layer (i.e., the second layer) may simultaneously or continuously occur. In this case, for example, as described above, by adjusting the temperature of the wafer 200 to control a degree of CVD reaction, the film forming reaction by the gas phase reaction between the BTCSM gas and the $NH_3$ gas can be appropriately progressed.

In addition, as the process of removing a residual gas is appropriately provided in the same way as the first modification, decomposed substances of the BTCSM gas or the like, or reaction byproducts produced by the formation of the first layer or the second layer are appropriately excluded from the process chamber 201. Accordingly, throughout the process of forming the SiCN film, a fresh gas is easily supplied to the wafer 200, and also, the inside of the process chamber 201 is easily maintained in an initial reaction state. Therefore, it is easy to obtain a film which is uniform in the thickness direction of the SiCN film. As the BTCSM gas is intermittently supplied and the time period in which at least the BTCSM gas is not supplied is provided in the same way as the second modification, predetermined effects similar to the above is also obtained. Further, as the BTCSM gas or the $NH_3$ gas is intermittently supplied in the same manner as the first and second modifications, the consumption of the BTCSM gas or the $NH_3$ gas can be suppressed and manufacturing costs can be reduced.

Further, in any case of the first to third modifications, if the process of supplying the BTCSM gas and the process of supplying the $NH_3$ gas are simultaneously initiated, in the early stage of the formation of the SiCN layer, only the first layer by the BTCSM gas may be precedently formed while N is not sufficiently introduced, in some cases. In addition, if the process of supplying the BTCSM gas and the process of supplying the $NH_3$ gas are simultaneously stopped, in the late stage of the formation of the SiCN layer, only the first layer by the BTCSM gas may be continuously formed while N is not sufficiently introduced, in some cases. Accordingly, the N concentration may not be uniform in the thickness direction of the SiCN layer or the SiCN film. As described above, as the process of supplying the $NH_3$ gas is initiated prior to the process of supplying the BTCSM gas and stopped posterior to the process of supplying the BTCSM gas, it is possible to suppress the non-uniformity of the concentration of N in the SiCN layer in the early and late stages of the formation of the SiCN layer. Therefore, the SiCN layer or the SiCN film having the composition more uniform in the thickness direction are obtained.

Furthermore, in any case of the first to third modifications, the concentration of N in the SiCN film can be controlled by adjusting the supply amount of the $NH_3$ gas supplied in the process of supplying the $NH_3$ gas.

More specifically, a ratio of a flow rate of the $NH_3$ gas supplied in the process of supplying the $NH_3$ gas to a total flow rate of the $NH_3$ gas and the BTCSM gas respectively supplied in the processes of supplying the $NH_3$ gas and the BTCSM gas is controlled. Using a flow rate $F_N$ of the $NH_3$ gas supplied into the process chamber 201 and a flow rate $F_T$ of the BTCSM gas supplied into the process chamber 201, a flow rate ratio $F_{RATIO}$ is obtained as $F_N/(F_N+F_T)$. The concentration of N in the SiCN film can be increased by increasing the flow rate ratio $F_{RATIO}$, and the concentration of N in the SiCN film can be decreased be decreasing the flow rate ratio $F_{RATIO}$.

The control of the flow rate ratio $F_{RATIO}$ corresponds to the control of a partial pressure of the $NH_3$ gas supplied in the process of supplying the $NH_3$ gas in the process chamber 201. Using the flow rate $F_N$ of the $NH_3$ gas supplied into the process chamber 201, the flow rate $F_T$ of the BTCSM gas supplied into the process chamber 201, a flow rate $F_I$ of the rest inert gas supplied into the process chamber 201, and a total pressure V in the process chamber 201, a partial pressure $V_N$ of the $NH_3$ gas in the process chamber 201 is obtained from an equation $V_N=[F_N/(F_N+F_T+F_I)]\times V$. As described above, here, the rest gas such as the inert gas needs to be considered. However, a relative change of a partial pressure ratio of the $NH_3$ gas and the BTCSM gas is firm, and the control of the partial pressure $V_N$ of the $NH_3$ gas may be the same as the control of the supply amount of the $NH_3$ gas or the control of the flow rate ratio $F_{RATIO}$. That is, the concentration of N in the SiCN film can be increased by increasing the partial pressure $V_N$ of the $NH_3$ gas, and the concentration of N in the SiCN film can be decreased by decreasing the partial pressure $V_N$ of the $NH_3$ gas.

In addition, since such a control is relative, the supply amount, the flow rate ratio, or the partial pressure of any one of the gases has only to change relative to any other gas. However, the present inventors found out that, for example, if the supply amount and the like of the $NH_3$ gas are controlled relative to the supply amount and the like of the BTCSM gas while those of the BTCSM gas are kept constant, the concentration of N in the SiCN film can be more easily controlled and the concentration of N in the SiCN film can be largely changed.

Further, in the first and second modifications, by adjusting the time duration or the number of times the process of supplying the BTCSM gas is performed, the concentration of C in the SiCN film can be controlled.

More specifically, in the first and second modifications, a ratio of a time duration of the process of supplying the $NH_3$ gas to a total time duration of both the process of supplying the BTCSM gas and the process of supplying the $NH_3$ gas is controlled. Using a time duration $T_T$ of performing the process of supplying the BTCSM gas and a time duration $T_N$ of performing the process of supplying the $NH_3$ gas, a performance time duration ratio $T_{RATIO}$ is obtained from an equation $T_T/(T_T+T_N)$. The concentration of C in the SiCN film can be increased by increasing the performance time duration ratio $T_{RATIO}$, and the concentration of C in the SiCN film can be decreased by decreasing the performance time duration ratio $T_{RATIO}$.

Particularly, in the second modification, the performance time duration ratio can be controlled by adjusting the number of times the process of supplying the BTCSM gas is performed per cycle. That is, in the second modification, the concentration of C in the SiCN film can be increased by increasing the number of times the process of supplying the BTCSM gas is performed per cycle and the concentration of C in the SiCN film can be decreased by decreasing the number of times the process of supplying the BTCSM gas is performed per cycle.

As described above, by controlling the concentration of N or C in the SiCN film, a concentration of another component in the film may also be relatively changed, or the absolute amount of each component, such as C or N, in the SiCN film may be changed. That is, by at least any one of the above-described cases, the concentration of Si, C, N or the like in the SiCN film may be relatively changed, or the absolute amount of C, N or the like may be changed. However, rather than the control of the supply amount, the flow rate ratio, or the partial pressure of a predetermined gas, the control of the supply time or the number of supply times of the predetermined gas makes the concentration control of each component in the SiCN film easier. In addition, the above-described method of controlling each component in the SiCN film can also be applied to the above-described embodiment.

Hereinabove, as a plurality of process recipes (programs with processing procedures or processing conditions written), in which the supply amount or the flow rate of the $NH_3$ gas, the time duration or the number of times the process of supplying the BTCSM gas is performed, and the like are set as different numerical values, are prepared in advance, it is easy to control the supply amount or the like of the NH$_3$ gas. An operator (or a manipulator) only has to appropriately select a suitable process recipe and perform the film forming process according to a desired film composition or the like. Therefore, the thin film having a variety of composition ratios and film qualities can be formed with high versatility and high reproducibility in one substrate processing apparatus. In addition, since an operator's work load (e.g., a load of inputting processing procedures or processing conditions, or the like) can be reduced, it is possible to rapidly initiate the substrate processing while avoiding an operational error.

Second Embodiment

Hereinafter, a second embodiment of the present disclosure will be described.

(1) Process of Forming Thin Film

In the above-described embodiment, examples of nitriding the first layer by supplying the NH$_3$ gas which is thermally activated under the non-plasma conditions have been described. The present embodiment is different from the above-described embodiment in that a plasma-activated NH$_3$ gas is supplied. Even in the present embodiment, the substrate processing apparatus shown in FIGS. 1 and 2 is employed in the same manner as the above-described embodiment. In the following description, the operations of the respective parts constituting the substrate processing apparatus are controlled by the controller 121.

Figure 6A:
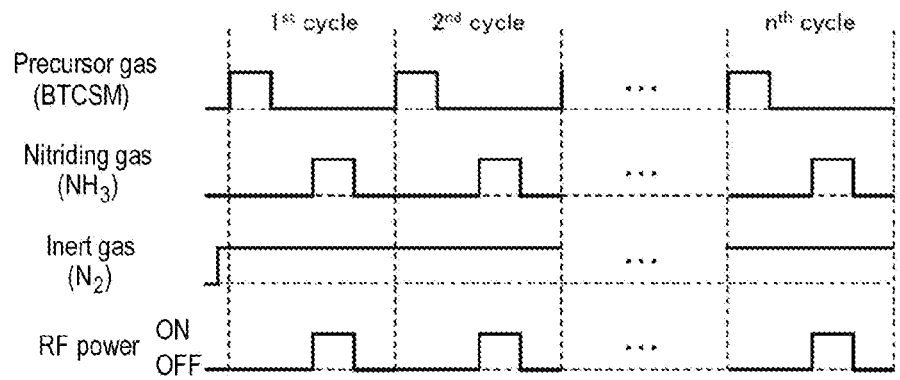
FIG. 6A is a view illustrating gas supply and RF power supply timings in a film forming sequence according to a second embodiment of the present disclosure.

As shown in FIG. 6A, in a cycle of the present embodiment, a process of supplying a BTCSM gas as a precursor gas to a wafer 200; and a process of supplying an NH$_3$ gas as a modifying gas to the wafer 200 are alternately performed, wherein in the process of supplying the NH$_3$ gas, a plasma-excited NH$_3$ gas is supplied to the wafer 200.

If the temperature of the wafer 200 in the above-described embodiment is set to a medium degree of temperature (i.e., medium temperature), in the present embodiment, an SiCN film may be formed by plasma-exciting the NH$_3$ gas and supplying the plasma-excited NH$_3$ gas even when the temperature of the wafer 200 is set to fall within a low temperature range. Hereinafter, a process of forming the SiCN film in the present embodiment will be described.
(Process of Forming SiCN Film)

In the process of forming the SiCN film, the following two steps, i.e., Steps 1b and 2b, are sequentially performed.
[Step 1b]
(BTCSM Gas Supply)

BTCSM gas is supplied to the wafer 200 in the same sequence as the above-described embodiment.

At this time, in the same sequence as the above-described embodiment, an inert gas such as N$_2$ gas is allowed to flow from the gas supply pipe 232e. When each gas is supplied, in the same manner as the above-described embodiment, in order to prevent infiltration of the gas into the nozzle 249b or the buffer chamber 237 that is not used at that time, the process of supplying the N$_2$ gas is appropriately performed.

Processing conditions, such as an internal pressure of the process chamber 201, a supply flow rate of the BTCSM gas or N$_2$ gas, and a supply time thereof, may be the same as the processing conditions when the BTCSM gas is supplied in the above-described embodiment shown in FIG. 5A, for example.

A temperature of the heater 207 may be set such that a temperature of the wafer 200 is lower than the temperature of the wafer 200 of the above-described embodiment. That is, the temperature of the heater 207 is set such that the temperature of the wafer 200 falls within a range of, for example, room temperature or greater and 450 degrees C. or less, or specifically, for example, 150 degrees C. or more to 350 degrees C. or less. If the temperature of the wafer 200 is less than 400 degrees C., it becomes difficult for the BTCSM to be chemisorbed onto the wafer 200, such that a practical film forming rate cannot be obtained. However, if the temperature of the wafer 200 is room temperature or greater, the BTCSM can be at least physisorbed onto the wafer 200, such that a practical film forming rate can be obtained by supplying the NH$_3$ gas which gets into a plasma state in a subsequent process as in the embodiment. In addition, if the temperature of the wafer 200 is less than room temperature, in some cases, it may be even difficult for the BTCSM to be physisorbed. Since the BTCSM can be at least physisorbed onto the wafer 200 by setting the temperature of the wafer 200 to room temperature or greater, or further, 150 degrees C. or more, a sufficient film forming rate can be obtained. In addition, as the temperature of the wafer 200 is set to 450 degrees C. or less, or further, 350 degrees C. or less, the amount of heat applied to the wafer 200 can be reduced, and thus, a thermal load applied to the wafer 200 can be reduced. If the temperature of the wafer 200 exceeds 450 degrees C., an advantage of controlling thermal budget of the wafer 200 recedes. Therefore, the temperature of the wafer 200 may fall within a range, for example, room temperature or greater and 450 degrees C. or less, or specifically, for example, 150 degrees C. or more to 350 degrees C. or less.

As the BTCSM gas is supplied under the above-described conditions, for example, an Si-containing layer containing C and Cl having a thickness of less than one atomic layer to several atomic layers, as a first layer, is formed on the wafer 200 (or a base film of its surface). The Si-containing layer containing C and Cl may be an Si layer containing C and Cl, an adsorption layer of the BTCSM gas, or both of these. Here, an adsorption layer of the BTCSM gas formed by physisorption due to insufficient pyrolysis, i.e., a physisorption layer of the BTCSM gas, may be mainly formed as the first layer. Even in this case, thereafter, as the NH$_3$ gas is plasma-excited and supplied to the wafer 200 in a process of supplying the NH$_3$ gas, the first layer may be changed to an SiCN layer by being nitrided with the NH$_3$ gas having high nitriding power.
(Residual Gas Removal)

Thereafter, in the same sequence as the above-described embodiment, the process of supplying the BTCSM gas is stopped, and a residual gas is removed from the process chamber 201.

The precursor gas containing at least two Si atoms per one molecule, C and a halogen element and having an Si—C bonding may include the various precursor gases exemplified above, in addition to the BTCSM gas. The inert gas may include the rare gases exemplified above, in addition to the N$_2$ gas.
[Step 2b]
(NH$_3$ Gas Supply)

After the residual gas in the process chamber 201 is removed, the valve 243b is opened to flow the NH$_3$ gas into the gas supply pipe 232b. The NH$_3$ gas, a flow rate of which is controlled by the MFC 241b, is supplied into the buffer chamber 237 through the gas supply holes 250b. At this time, by applying high-frequency (e.g., RF) power between the rod-shaped electrodes 269 and 270 from the high-frequency power source 273 through the matcher 272, the $NH_3$ gas supplied into the buffer chamber 237 is plasma-excited. The plasma-excited $NH_3$ gas is supplied as an active species into the process chamber 201 through the gas supply holes 250c, and exhausted through the exhaust pipe 231. With such configuration, the plasma-activated (or excited) $NH_3$ gas is supplied to the wafer 200. At the same time, the valve 243f is opened to flow $N_2$ gas into the gas supply pipe 232f. The $N_2$ gas, a flow rate of which is controlled by the MFC 241f, is supplied into the process chamber 201 together with the $NH_3$ gas and exhausted through the exhaust pipe 231. When each gas is supplied, in the same manner as the above-described embodiment, in order to prevent infiltration of the gas into the nozzle 249a that is not used at that time, the process of supplying the $N_2$ gas is appropriately performed.

Processing conditions, such as an internal pressure of the process chamber 201, a supply flow rate of the $NH_3$ gas or $N_2$ gas, and a supply time thereof, may be the same as the processing conditions when the $NH_3$ gas is supplied in the above-described embodiment shown in FIG. 5A, for example.

A temperature of the heater 207 is set such that a temperature of the wafer 200 falls within the same temperature range as when the BTCSM gas is supplied in the present embodiment, i.e., a range of, for example, room temperature or greater and 450 degrees C. or less, or specifically, for example, 150 degrees C. or more to 350 degrees C. or less. In addition, the high-frequency power applied between the rod-shaped electrodes 269 and 270 from the high-frequency power source 273 is set to fall within a range of, for example, 50 to 1000 W.

At this time, the gas flowing in the process chamber 201 is the plasma-excited $NH_3$ gas and contains, for example, an active species such as an N radical (N*). In addition, the BTCSM gas does not flow into the process chamber 201. Therefore, the $NH_3$ gas is supplied to the wafer 200 in the activated state without a gas phase reaction, and nitriding is performed on the first layer formed on the wafer 200 mainly by the active species. The energy of the active species is higher than, for example, the energy of the $NH_3$ gas thermally activated as in the above-described embodiment. Accordingly, as the energy of the active species is given to the first layer, for example, although the first layer formed under low temperature conditions is mainly a physisorption layer of the BTCSM gas, the first layer can be changed to a second layer containing Si, C and N, i.e., an SiCN layer (modification processing).

Since the $N_2$ gas flowing together with the $NH_3$ gas has relatively low ionization energy, the $N_2$ gas itself is plasma-excited and acts as an assist gas, which assists plasma ignition. In this way, as the high-frequency power is applied between the rod-shaped electrodes 269 and 270 from the high-frequency power source 273 in the presence of the $N_2$ gas, it is easier to plasma-excite the $NH_3$ gas. At this time, for example, the process of supplying the $N_2$ gas is initiated prior to the process of supplying the $NH_3$ gas, and the process of supplying the $NH_3$ gas may be initiated after the high-frequency power is applied between the rod-shaped electrodes 269 and 270 from the high-frequency power source 273. Accordingly, the $NH_3$ gas is supplied into an $N_2$ gas atmosphere in a plasma state in the buffer chamber 237, thereby making it easier to plasma-excite the $NH_3$ gas. The $N_2$ gas may act as an assist gas, which assists disassociation of the $NH_3$ gas in plasma.

(Residual Gas Removal)

After the second layer is formed on the wafer 200, the application of the high-frequency power between the rod-shaped electrodes 269 and 270 from the high-frequency power source 273 is stopped. Further, in the same sequence as the above-described embodiment, the process of supplying the $NH_3$ gas is stopped, and a residual gas is removed from the inside of the process chamber 201.

The nitriding gas may include the N-containing gas or the $N_2$ gas exemplified above, in addition to the $NH_3$ gas. The assist gas which assists plasma ignition may include a rare gas such as Ar gas, He gas, Ne gas, Xe gas, and the like, in addition to the $N_2$ gas. The inert gas may include the various rare gases exemplified above, in addition to the $N_2$ gas.

Even when instead of the $NH_3$ gas, various types of N-containing gases are supplied in a plasma state, by using the N-containing gas together with at least any one of the above-described assist gases, the N-containing gas can be excited by plasma of the assist gas and supplied. In addition, when the $N_2$ gas is supplied as the N-containing gas, the $N_2$ gas may be supplied not after only the $N_2$ gas solely gets into plasma without using the assist gas but also the $NH_3$ gas or another N-containing gas solely gets into plasma.

(Performing Predetermined Number of Times)

As the above-described Steps 1b and 2b are set as one cycle and the cycle is performed one or more times, i.e., a predetermined number of times (n times), the SiCN film having a predetermined composition and a predetermined film thickness can be formed on the wafer 200. The above-described cycle may be repeated a plurality number of times. That is, a thickness of an SiCN layer formed per cycle may be set to be smaller than a desired film thickness and the above-described cycle be repeated a plurality number of times until the desired film thickness is obtained.

(2) Effects According to the Embodiment

According to the embodiment, one or more effects are shown as described below in addition to the same effects as the above-described first embodiment.

(a) According to the film forming sequence of the embodiment, in the process of supplying the $NH_3$ gas, the plasma-excited $NH_3$ gas is supplied to the wafer 200. Accordingly, the $NH_3$ gas gets into a more activated state than thermally activated $NH_3$ gas, such that the modification reaction (nitriding reaction) of the $NH_3$ gas on the first layer can be remarkably improved. Therefore, since the first layer can be more securely nitrided into the second layer, the finally obtained SiCN film may be of higher quality.

(b) According to the film forming sequence of the embodiment, the plasma-excited $NH_3$ gas can make the nitriding reaction on the first layer be remarkably improved. Therefore, both the process of supplying the BTCSM gas and the process of supplying the $NH_3$ gas may be performed under a low temperature condition of 450 degrees C. or less. That is, for example, the first layer which is formed under a low temperature condition of 450 degrees C. or less and mainly consists of a physisorption layer of the BTCSM gas can also be more securely nitrided in the process of supplying the $NH_3$ gas. In addition, even when the process of supplying the $NH_3$ gas itself is performed under a low temperature condition of 450 degrees C. or less, the nitriding can be performed on the SiCN layer. Therefore, thermal budget of the wafer 200 can be improved.

(3) Modifications of the Embodiment

Next, first and second modifications of the embodiment will be described with reference to FIGS. 6B, 6C and 7.

In a film forming sequence shown in FIG. 6A, an example in which one type of the precursor gas or the modifying gas is used to form a film has been described. In the first and second modifications shown in FIGS. 6B, 6C and 7, examples in which two or more types of precursor gases or two or more types of modifying gases are used to perform film forming processing will be described.

(First Modification)

Figure 6B:
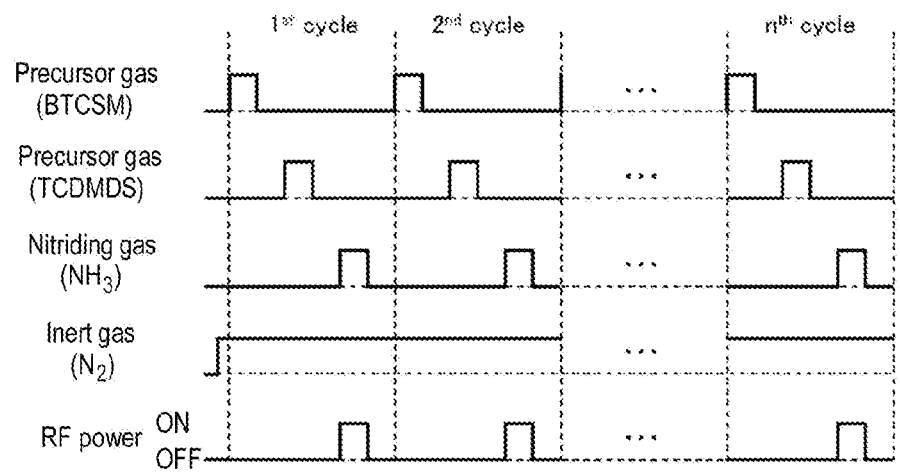
FIGS. 6B and 6C are views illustrating gas supply and RF power supply timings according to first and second modifications thereof.
Figure 7:
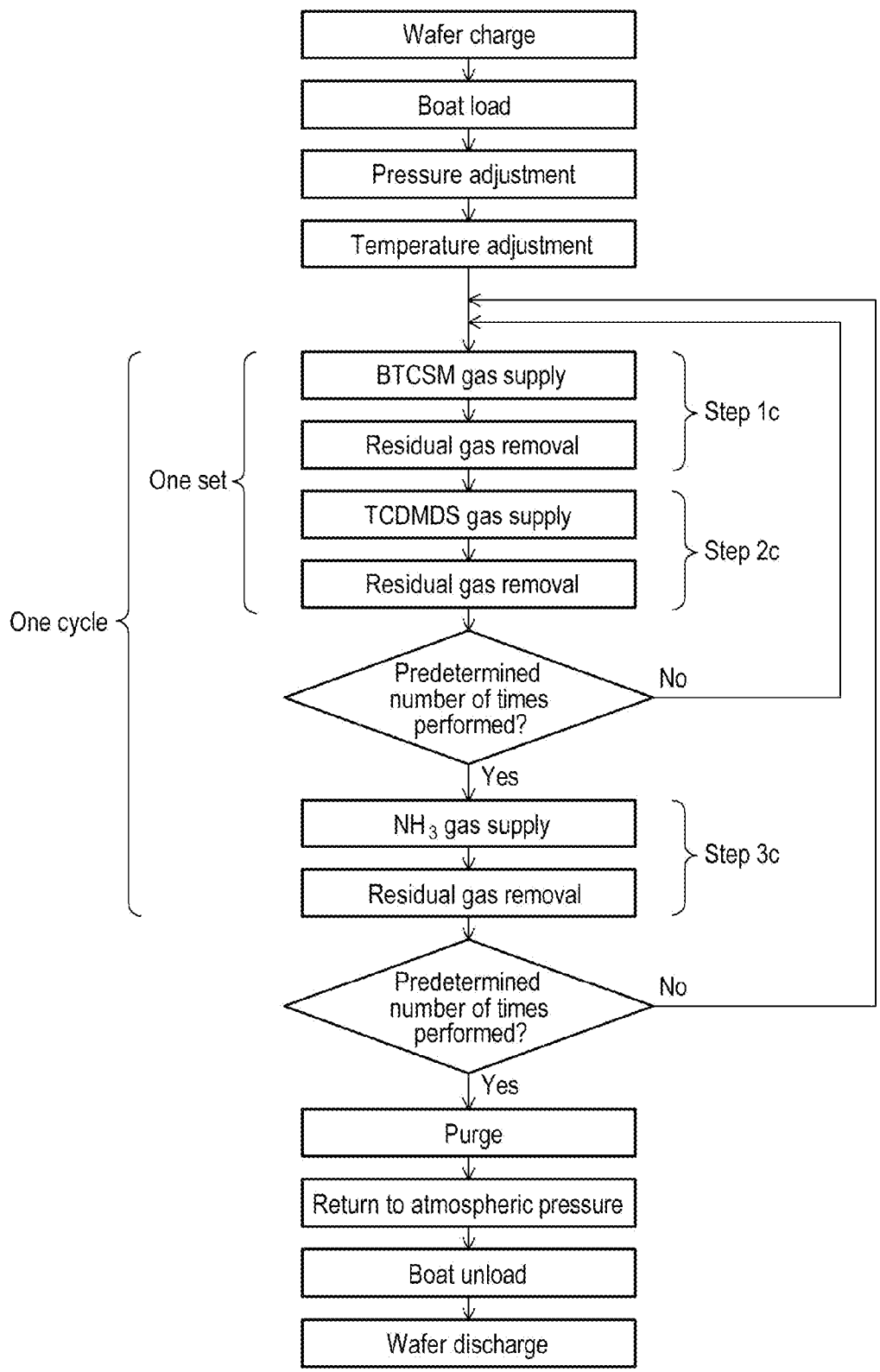
FIG. 7 is a view illustrating a flow of film formation in the film forming sequence according to the first modification of the second embodiment of the present disclosure.

As shown in FIGS. 6B and 7, in the first modification, an SiCN film as a thin film containing Si, C and N is formed on a wafer 200 by performing a cycle a predetermined number of times, the cycle including: a process of supplying a BTCSM gas as a precursor gas to the wafer 200; and a process of supplying an $NH_3$ gas as a modifying gas to the wafer 200, wherein the cycle further includes: a process of supplying a TCDMDS gas as another precursor gas containing at least two Si atoms per one molecule, C and a halogen element and having an Si—C bonding, the other precursor gas having a different molecular structure from the above-described precursor gas.

Here, the cycle includes: a process of performing a set a predetermined number of times, the set including supplying the BTCSM gas as the first precursor gas (Step 1c) and supplying the TCDMDS gas as the second precursor gas (Step 2c); and a process of supplying the $NH_3$ gas (Step 3c), wherein in the process of supplying the $NH_3$ gas, the plasma-excited $NH_3$ gas is supplied to the wafer 200.

As shown in FIG. 7, the set and the cycle may be performed one or more times, i.e., a predetermined number of times. Any one of Steps 1c and 2c may be first initiated. Hereinafter, as shown in FIG. 6B, an example in which the set in which Step 1c is first initiated is performed once and the cycle is performed a plurality number of times (e.g., n times) will be described.

In addition, the sequence of the modification may be the same as the film forming sequence of the second embodiment except that there are differences only in terms of Step 2c further included and the performance order of the processes. Hereinafter, Step 2c of the first modification will be mainly described.

[Step 2c]
(TCDMDS Gas Supply)

After the Si-containing layer containing C and Cl is formed on the wafer 200 by Step 1c, which is performed in the same manner as the above-described processes of supplying the BTCSM gas and removing the residual gas, a TCDMDS gas is supplied to the wafer 200.

That is, the valve 243c is opened to flow the TCDMDS gas into the gas supply pipe 232c. The TCDMDS gas, the flow rate of which is controlled by the MFC 241c, passes through the gas supply pipe 232a, is supplied into the process chamber 201 through the gas supply holes 250a, and is exhausted through the exhaust pipe 231. At this time, the TCDMDS gas is supplied to the wafer 200. At the same time, the valve 243e is opened to flow an inert gas such as the $N_2$ gas into the gas supply pipe 232e. The $N_2$ gas, the flow rate of which is controlled by the MFC 241e, is supplied into the process chamber 201 together with the TCDMDS gas and exhausted through the exhaust pipe 231. In addition, when each gas is supplied, in the same manner as the above-described embodiment, in order to prevent infiltration of the gas into the nozzle 249b or the buffer chamber 237 that is not used at that time, the process of supplying the $N_2$ gas is appropriately performed.

In this way, as the TCDMDS gas is supplied to the wafer 200, an Si-containing layer containing C and Cl is also formed on the Si-containing layer containing C and Cl formed on the wafer 200 by the BTCSM gas. The Si-containing layer containing C and Cl may be an Si layer containing C and Cl or an adsorption layer of the TCDMDS gas, or include both of them.

Accordingly, the Si-containing layer containing C and Cl formed by the BTCSM gas and the Si-containing layer containing C and Cl formed by the TCDMDS gas are stacked, thereby forming a first layer having a thickness of, for example, less than one atomic layer to several atomic layers. Here, for example, an adsorption layer of the BTCSM gas and the TCDMDS gas by physisorption due to insufficient pyrolysis, i.e., a physisorption layer of the BTCSM gas and the TCDMDS gas, is mainly formed as the first layer.

However, the Si-containing layer containing C and Cl originated from the BTCSM gas and the Si-containing layer containing C and Cl originated from the TCDMDS gas may not be in a stacked state having an obvious boundary, and may be in an intermixed state. When the TCDMDS gas is supplied, a reaction occurs between the TCDMDS gas and the Si-containing layer containing C and Cl previously formed and originated from the BTCSM gas, and these layers get into a more intermixed state. In this case, for example, at least a portion of Cl in the Si-containing layer containing C and Cl originated from the BTCSM gas reacts with at least a portion of methyl groups in the TCDMDS gas molecules. Accordingly, a substance such as a chloromethane ($CH_xCl_y$) is produced, so that Cl is desorbed (or extracted) from the Si-containing layer containing C and Cl and the methyl groups are also separated from the TCDMDS gas molecules. In addition, Si that has a dangling bond due to a loss of Cl in the Si-containing layer containing C and Cl, Si that has had a dangling bond, and Si that has a dangling bond due to a loss of the methyl group in the TCDMDS gas molecule are bonded to form an Si—Si bonding. Accordingly, the first layer in which the layers originated from the respective precursor gases are intermixed is formed. Even when the performance order of Steps 1c and 2c are changed such that the TCDMDS gas is supplied and then the BTCSM gas is supplied, the same reaction may occur. In this case, at least a portion of C in the Si-containing layer containing C and Cl originated from the TCDMDS gas, for example, residual methyl groups, and at least a portion of halogen groups (Cl) in the BTCSM gas molecules react with each other.

In addition, processing conditions, such as an internal pressure of the process chamber 201, a supply flow rate of the precursor gases, the $N_2$ gas and the like, a supply time thereof, and a temperature of the wafer 200 at that time, may be the same as the processing conditions in the above-described film forming sequence shown in FIG. 6A, for example.

(Residual Gas Removal)

After the first layer is formed on the wafer 200, the valve 243c is closed to stop the process of supplying the TCDMDS gas. Then, in the same sequence as the above-described embodiment, a residual gas is removed from the inside of the process chamber 201.

Thereafter, in Step 3c performed in the same manner as the above-described processes of supplying the $NH_3$ gas and removing the residual gas, the $NH_3$ gas is plasma-excited and supplied to the wafer 200. Accordingly, as described above, the Si-containing layer containing C and Cl which mainly consists of the physisorption layer of the BTCSM gas and TCDMDS gas can also be changed to an SiCN layer by being nitrided by the $NH_3$ gas having high nitriding power.

In addition, the above-described Steps 1c, 2c and 3c are set as one cycle and the cycle is performed one or more times (a predetermined number of times), thereby forming the SiCN film on the wafer 200.

As described above, when the film forming process is performed using two or more types of precursor gases containing at least two Si atoms per one molecule, C and a halogen element having an Si—C bonding, which have different molecular structures from each other, any gas combination of BTCSM gas, BTCSE gas, TCDMDS gas, DCTMDS gas, and MCPMDS gas may be used. All the gases are precursor gases that become Si sources and C sources. In this way, as a film is formed using two types of Si sources (double silicon sources) and two types of C sources (double carbon sources) in one cycle, various controls of a composition or the like of the thin film to be formed can be more accurately and easily performed. For example, although these gases have the same type of the contained element or an Si—C bonding, these gases have different numbers of Cl contained and thus have different reactivities. In addition, these gases have different introduction positions of C in gas molecules and thus are different from each other in easiness of desorption of a C-containing group or easiness of introduction of a C-containing group into a film. Therefore, instead of a predetermined gas introduced at first, another gas having different reactivity can be newly introduced, as described above, for example, these precursor gases react with each other and it is possible to accelerate a film forming rate, increase an Si concentration relative to an N concentration, or increase a C concentration introduced into the film by minutely controlling the C concentration. Examples of an appropriate combination among the precursor gases exemplified above include, for example, a combination of the BTCSM gas and the DCTMDS gas, a combination of the TCDMDS gas and the DCTMDS gas, and the like, in addition to the above-described combination of the BTCSM gas and the TCDMDS gas.

In addition, when the film forming process is performed using two or more types of precursor gases having different molecular structures, the first precursor gas, such as the BTCSM gas, and the second precursor gas, such as a halosilane-based precursor gas not containing C, which contains at least Si and a halogen element and has a molecular structure different from the BTCSM gas or the like, may be used. In this case, the halosilane-based precursor gas not containing C may include, for example, hexachlorodisilane ($Si_2Cl_6$, abbreviation: HCDS) gas, trichlorosilane ($SiHCl_3$, abbreviation: TCS) gas, silicontetrachloride ($SiCl_4$, abbreviation: STC) gas, dichlorosilane ($SiH_2Cl_2$, abbreviation: DCS) gas, monochlorosilane ($SiH_3Cl$, abbreviation: MCS) gas and the like. These gases are precursor gases which become not C sources but Si sources. In this way, as a film is formed using two types of Si sources (double silicon sources) in one cycle, various controls of a composition or the like of the thin film to be formed can be more accurately or easily performed. That is, with the combination of the above-described halosilane-based precursor gas not containing C and the above-described precursor gas having an Si—C bonding, an Si-containing layer containing Cl and not containing C and an Si-containing layer containing C and Cl may be stacked to form a first layer, and thus, the controllability of a concentration of C in the finally obtained thin film can be more improved. However, these layers may not have an obvious boundary and may also be in an intermixed state. In this case, an Si-containing layer containing C and Cl having a lower C concentration than, for example, a first layer formed using one or two types of gases which become the C sources, is formed as the first layer. Examples of an appropriate combination among the precursor gases exemplified above include, for example, a combination of the BTCSM gas and the HCDS gas, a combination of the TCDMDS gas and the HCDS gas, a combination of the DCTMDS gas and the HCDS gas, and the like.

(Second Modification)

Figure 6C:
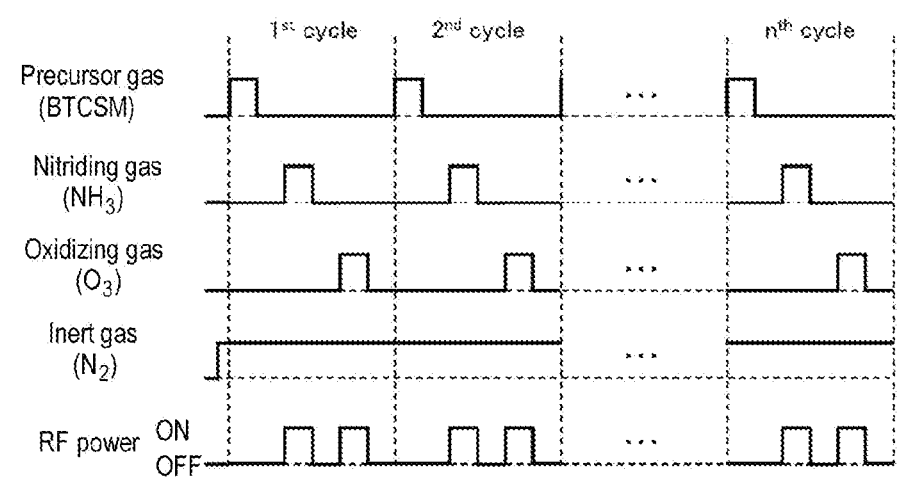

As shown in FIG. 6C, in the second modification, a silicon oxycarbonitride film (SiOCN film) is formed as a thin film containing Si, O, C and N on a wafer 200 by performing a cycle a predetermined number of times, the cycle including: a process of supplying a BTCSM gas as a precursor gas to the wafer 200; and a process of supplying an $NH_3$ gas containing N as a first modifying gas containing any one of N and O to the wafer 200, wherein the cycle further includes: a process of supplying an $O_2$ gas containing 0 as a second modifying gas containing the other one of N and O to the wafer 200.

Hereinabove, the first modifying gas contains any one of N and O, and the second modifying gas contains the other one of N and O, i.e., the element other than the element contained in the first modifying gas. The SiOCN film formed using these gases may be referred to as a silicon oxide film (SiO film) doped with C and N (or having C and N added), a silicon oxynitride film (SiON film) doped with C, a silicon oxycarbide film (SiOC film) doped with N, or the like.

Here, in the cycle, the process of supplying the BTCSM gas, the process of supplying the $NH_3$ gas, and the process of supplying the $O_2$ gas are set as one cycle and the cycle is performed a predetermined number of times, wherein in the process of supplying the $NH_3$ gas and the process of supplying the $O_2$ gas, the $NH_3$ gas and the $O_2$ gas are plasma-excited and supplied to the wafer 200, respectively.

Each process in the cycle and the cycle may be respectively performed one or more times, i.e., a predetermined number of times. In addition, any one of the process of supplying the $NH_3$ gas and the process of supplying the $O_2$ gas may be performed prior to the other. Hereinafter, as shown in FIG. 6C, an example in which the process of supplying the BTCSM gas, the process of supplying the $NH_3$ gas, and the process of supplying the $O_2$ gas each are performed once in this order, and the cycle is performed a plurality number of times (e.g., n times) will be described.

In addition, the sequence of the present modification may be the same as the film forming sequence of the second embodiment except that there are differences only in terms of the process of supplying the $O_2$ gas further included and the performance order of the processes. Hereinafter, the process of supplying the $O_2$ gas will be mainly described.

($O_2$ Gas Supply)

The process of supplying the BTCSM gas and the process of supplying the $NH_3$ gas, which are performed in the same manner as the above-described embodiment, are performed with a process of removing a residual gas appropriately interposed therebetween, an SiCN layer is formed as a second layer on the wafer 200, and then, the $O_2$ gas is supplied.

That is, the valve 243d is opened to flow the $O_2$ gas into the gas supply pipe 232d. The $O_2$ gas, a flow rate of which is controlled by the MFC 241d, passes through the gas supply pipe 232b and is supplied into the buffer chamber 237 through the gas supply holes 250b. At this time, by applying high-frequency (RF) power between the rod-shaped electrodes 269 and 270 from the high-frequency power source 273 through the matcher 272, the $O_2$ gas supplied into the buffer chamber 237 is plasma-excited, supplied as an active species into the process chamber 201 through the gas supply holes 250c, and exhausted through the exhaust pipe 231. In this case, the $O_2$ gas plasma-activated (or excited) is supplied to the wafer 200. At the same time, the valve 243f is opened to flow the $N_2$ gas into the gas supply pipe 232f. The $N_2$ gas, a flow rate of which is controlled by the MFC 241f, is supplied into the process chamber 201 together with the $O_2$ gas, and exhausted through the exhaust pipe 231. Further, when each gas is supplied, in the same manner as the above-described embodiment, in order to prevent infiltration of the gas into the nozzle 249a that is not used at that time, the process of supplying the $N_2$ gas is appropriately performed.

At this time, the gas flowing in the process chamber 201 is the plasma-excited $O_2$ gas and contains, for example, an active species such as an O radical (O*). In addition, the BTCSM gas does not flow into the process chamber 201. Therefore, the $O_2$ gas is supplied to the wafer 200 in the activated state without a gas phase reaction, and oxidizing is performed on the second layer formed on the wafer 200 mainly by the active species. The energy of the active species is higher than, for example, the energy of the $O_2$ gas which is thermally activated. Accordingly, as the energy of the active species is applied to the second layer, for example, the second layer can be changed to a third layer containing Si, O, C and N, i.e., an SiOCN layer (modification processing).

The $N_2$ gas flowing together with the $O_2$ gas acts as an assist gas, which assists plasma ignition. In this time, for example, the process of supplying the $N_2$ gas may be initiated prior to the process of supplying the $O_2$ gas. The $N_2$ gas may act as an assist gas, which assists disassociation of the $O_2$ gas in plasma.

In addition, processing conditions, such as an internal pressure of the process chamber 201, a supply flow rate of each of the gases such as the modifying gases and the $N_2$ gas, a supply time thereof, and a temperature of the wafer 200 at that time, may be the same as the processing conditions in the above-described film forming sequence shown in FIG. 6A, for example. For example, a supply flow rate of the $O_2$ gas may fall within a range of, for example, 1,000 to 10,000 sccm, or specifically, for example, 1,000 to 9,000 sccm. In addition, a time duration of supplying the $O_2$ gas to the wafer 200, i.e., a gas supply time (i.e., an irradiation time), is set to fall within a range of, for example, 1 to 100 seconds, or specifically, for example, 5 to 60 seconds.

However, RF power may be set to be smaller than the RF power (e.g., 50 to 1,000 W) in the process of supplying the $NH_3$ gas or set to zero (non-plasma). For example, the RF power may be set to fall within a range of 0 to 50 W. Further, that a supply flow rate of the $O_2$ gas may be set to be smaller than the supply flow rate of the $NH_3$ gas in the process of supplying the $NH_3$ gas, or a supply flow rate of the $N_2$ gas flowing simultaneously with the $O_2$ gas may be set to be larger than the supply flow rate of the $N_2$ gas flowing simultaneously with the $NH_3$ gas in the process of supplying the $NH_3$ gas. In addition, a ratio of a supply flow rate of the $O_2$ gas to a supply flow rate of the $N_2$ gas (i.e., $O_2/N_2$ gas flow rate ratio) may be set to be smaller than the ratio of the supply flow rate of the $NH_3$ gas to the supply flow rate of the $N_2$ gas in the process of supplying the $NH_3$ gas (i.e., $NH_3/N_2$ gas flow rate ratio). Accordingly, since a partial pressure of the $O_2$ gas in the process chamber 201 may be set to be smaller than a partial pressure of the $NH_3$ gas in the process chamber 201 in the process of supplying the $NH_3$ gas, the oxidizing power of the $O_2$ gas plasma-activated or the $O_2$ gas thermally activated by setting the RF power to zero is prevented from being excessively increased, and thus, desorption of C from the second layer can be suppressed. That is, an oxidation reaction of the second layer with the $O_2$ gas may be made unsaturated to thereby maintain the Si—C bonding contained in the second layer without being broken, and thus, a high C concentration can be maintained. In addition, the same effects may be obtained even if the partial pressure of the $O_2$ gas in the process chamber 201 is set to be smaller than the partial pressure of the BTCSM gas in the process chamber 201 in the process of supplying the BTCSM gas by setting a supply flow rate of the $N_2$ gas flowing simultaneously with the $O_2$ gas to be higher than a supply flow rate of the $N_2$ gas flowing simultaneously with the BTCSM gas in the process of supplying the BTCSM gas or setting a ratio of a supply flow rate of the $O_2$ gas to a supply flow rate of the $N_2$ gas (i.e., $O_2/N_2$ gas flow rate ratio) to be lower than the ratio of the supply flow rate of the BTCSM gas to a supply flow rate of the $N_2$ gas in the process of supplying the BTCSM gas (i.e., $BTCSM/N_2$ gas flow rate ratio).

(Residual Gas Removal)

After the third layer is formed on the wafer 200, the application of the high-frequency power between the rod-shaped electrodes 269 and 270 from the high-frequency power source 273 is stopped. The valve 243d is closed to stop the process of supplying the $O_2$ gas. Further, in the same sequence as the above-described embodiment, a residual gas is removed from the inside of the process chamber 201.

Examples of the oxidizing gas may include an O-containing gas such as nitrogen monoxide (NO) gas, nitrous oxide ($N_2O$) gas, carbon monoxide (CO) gas, and carbon dioxide ($CO_2$) gas, in addition to the oxygen ($O_2$) gas. Examples of the assist gas and the inert gas may include the above-described rare gases, in addition to the $N_2$ gas. The O-containing gas may be solely plasma-excited and supplied without using the assist gas.

Thereafter, the above respective processes are set as one cycle and the cycle is performed one or more times (e.g., a predetermined number of times), thereby forming the SiOCN film having a predetermined composition and a predetermined film thickness on the wafer 200.

As described above, as the SiOCN film is formed as a thin film, a thin film having more various compositions can be obtained and also the composition controllability of such thin film can be more improved. For example, the SiOCN film is a film having a lower dielectric constant than the SiCN film. In this way, the dielectric constant can be lowered by introducing a new element such as O into the SiCN film. Further, since a concentration ratio of the respective components in the SiOCN film may be controlled by changing a ratio of the time duration or the number of times the process of supplying the $NH_3$ gas and the process of supplying the $O_2$ gas are respectively performed, it is even easier to control film properties such as a dielectric constant.

In addition, the process of supplying the $O_2$ gas may be applied to the above-described film forming sequence of FIG. 6B. That is, in the same manner as the film forming sequence of FIG. 6B, after the two or more types of precursor gases are supplied as double silicon sources or double carbon sources, the process of supplying the $NH_3$ gas and the process of supplying the $O_2$ gas are performed. Even by doing so, the SiOCN film can be formed.

Further, a film composition may also be finely controlled by performing the process of supplying the $O_2$ gas. In this case, after performing any one of the film forming sequences of the above-described various embodiments or modifications, the process of supplying the $O_2$ gas is performed as the final process, for example. Accordingly, at least a surface layer portion of each film is modified (e.g., oxidized), thereby being capable of finely controlling the final composition of each film.

Further, the methods of the above-described first and second modifications may also be applied to the above-described first embodiment or the modifications thereof.

That is, the film forming process performed using two or more types of precursor gases as double silicon sources or double carbon sources may be performed in the same temperature range (or the same temperature) as the above-described first embodiment under the same non-plasma atmosphere as the above-described first embodiment. In addition, the film forming process performed using both the nitriding gas and the oxidizing gas as the modifying gases may be performed in the same temperature range (or the same temperature) as the above-described first embodiment under the same non-plasma atmosphere as the above-described first embodiment. As this film forming process is performed in such a temperature range, the first layer formed in the process of supplying the precursor gas may not be a physisorption layer but a chemisorption layer or a layer mainly consisting of an Si layer containing C and Cl. When two or more types of precursor gases are used, the reaction between both the gases more easily occurs. Also, even in the subsequent process of supplying the modifying gas, the modification (e.g., nitridation, oxidization, or both of them) may be performed on the first layer in the same temperature range (or the same temperature) as the above-described first embodiment under the non-plasma atmosphere.

In addition, as described above, the substrate processing apparatus according to the embodiments and modifications is configured to include a plurality of precursor gas supply lines or a plurality of modifying gas supply lines and to select and supply a specific gas among a plurality of types of gases containing different predetermined elements or a plurality of types of gases having different molecular structures. With this configuration, it is easy to select and supply a specific precursor gas or modifying gas among a plurality of types of gases according to a desired film composition or the like. Therefore, the thin film having a variety of composition ratios and film qualities can be formed with high versatility and high reproducibility in one substrate processing apparatus. In addition, it is possible to secure a degree of freedom of apparatus management when a gas species is added, replaced, or the like.

In addition, the substrate processing apparatus according to the embodiments and modifications may be provided with a plurality of process recipes (e.g., programs in which processing sequences or processing conditions are written), which are used in forming the above-described various types of thin films, for respective types of precursor gases or modifying gases, i.e., respective different gas system, in advance. That is, in the substrate processing apparatus according to the embodiments and modifications, a plurality of process recipes may be respectively provided for different processing conditions. With this configuration, it is easy to select and supply a specific precursor gas or modifying gas among a plurality of types of gases according to a desired film composition or the like. An operator has only to appropriately select a suitable process recipe according to a desired film composition among the plurality of process recipes and perform the film forming process. Therefore, the thin film having a variety of composition ratios and film qualities can be formed with high versatility and high reproducibility in one substrate processing apparatus. In addition, since an operator's work load (e.g., a load of inputting processing procedures or processing conditions, or the like) can be reduced, it is possible to rapidly initiate the substrate processing while avoiding an operational error.

Other Embodiments

Hereinabove, while the embodiments of the present disclosure have been specifically described, the present disclosure is not limited to the above-described embodiments and modifications and may be variously modified without departing from the spirit of the present disclosure.

For example, in the above-described embodiments and the like, it has been described as an example that when the modifying gas such as the $NH_3$ gas is plasma-excited and supplied to the wafer 200, the nozzle 249b, which is commonly used to supply the $N_2$ gas as the assist gas, is used to supply the $NH_3$ gas together with the $N_2$ gas into the process chamber 201 through the buffer chamber 237. However, the $NH_3$ gas may be supplied into the process chamber 201 from a nozzle, which is separate from the nozzle 249b for supply the $N_2$ gas and the like and installed outside the buffer chamber 237 without passing through the buffer chamber 237. Even in this case, the $NH_3$ gas supplied into the process chamber 201 may be plasma-excited by the assistance of the $N_2$ gas or the like supplied into the process chamber 201 in a plasma state through the gas supply holes 250c.

While the $N_2$ gas as the inert gas has been used as the assist gas in the above-described embodiments and the like, the assist gas may be supplied from an assist gas supply line installed separately from the inert gas supply line.

Figure 8A:
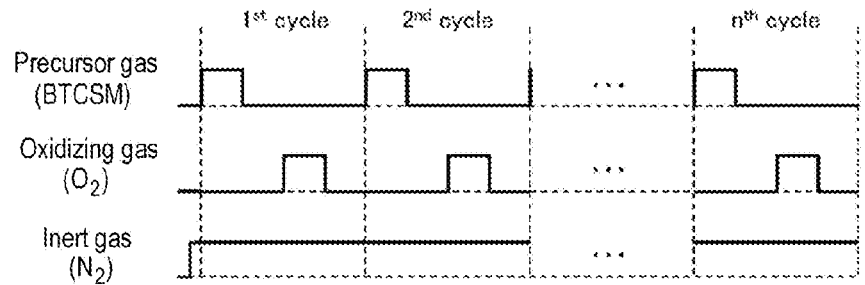
FIGS. 8A to 8C are views illustrating gas supply timings in film forming sequences according to other embodiments.
Figure 8B:
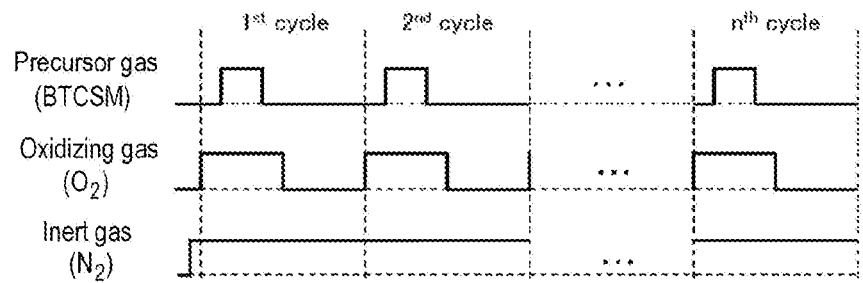
Figure 8C:
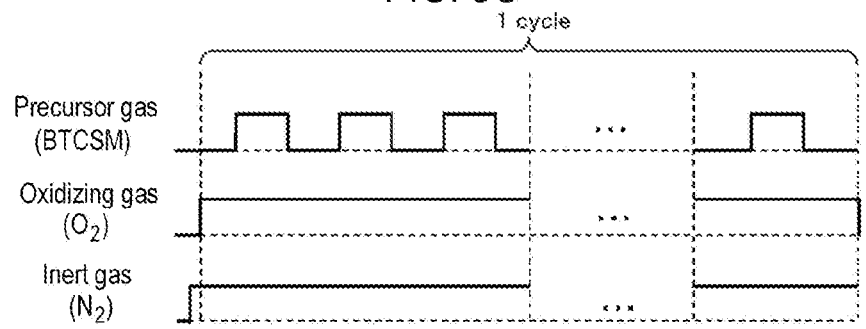
Figure 8D:
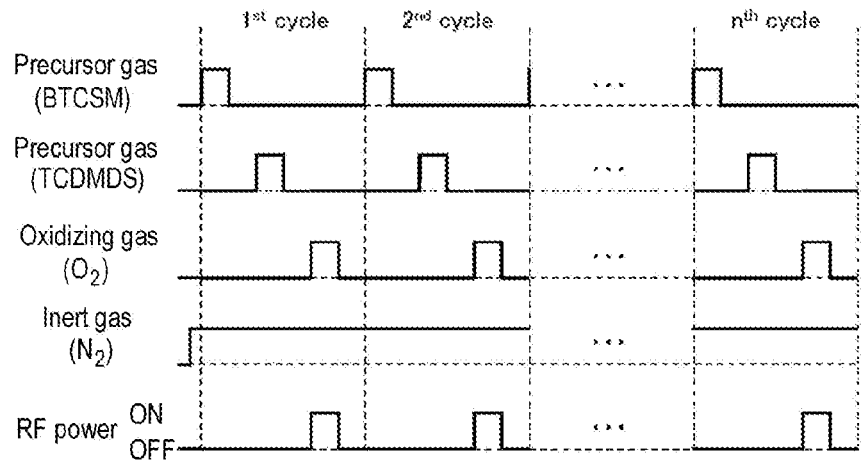
FIG. 8D is a view illustrating gas supply and RF power supply timings in a film forming sequence according to still another embodiment.

While it has been described as an example in the above-described embodiments and the like that the SiCN film or the SiOCN film is formed as a thin film, an SiOC film may be formed using an oxidizing gas instead of a nitriding gas as the modifying gas. That is, in the film forming sequence of the above-described embodiments or modifications, the first layer formed through the process of supplying the precursor gas may be oxidized, for example, by performing a process of supplying an $O_2$ gas instead of the process of supplying the $NH_3$ gas, thereby forming a silicon oxycarbide layer (SiOC layer) as the second layer. The thin film of the SiOC film may have a further lower dielectric constant since the SiOC film has a lower dielectric constant than the SiCN film. FIGS. 8A to 8D show several examples of the film forming sequences. In FIGS. 8A to 8D, each process of supplying a gas may be performed under the conditions of the corresponding process of the above-described embodiments or modifications. In FIG. 8A, an oxidizing gas may be plasma-excited and supplied by applying RF power when the oxidizing gas is supplied. In FIG. 8D, an oxidizing gas may be supplied under a non-plasma atmosphere without applying RF power when the oxidizing gas is supplied. However, when an oxidizing gas is plasma-excited and supplied by applying RF power, the oxidizing power of the plasma-activated oxidizing gas may be prevented from being excessively increased by lowering the RF power or a partial pressure of the oxidizing gas in the process chamber 201 as described above so that desorption of C from the formed layer is suppressed. In addition, even when an oxidizing gas is thermally activated and supplied under non-plasma conditions without applying RF power the oxidizing power of the thermally activated oxidizing gas may be prevented from being excessively increased by lowering a partial pressure of the oxidizing gas in the process chamber 201 as described above so that desorption of C from the formed layer is suppressed. That is, the oxidizing power may be suppressed (or the oxidation reaction may be made unsaturated) by controlling various types of processing conditions such as the RF power or the partial pressure of the oxidizing gas when the oxidizing gas is supplied, and thus, an Si—C bonding contained in the formed layer may be maintained without being broken. Accordingly, it is possible to keep the concentration of C in the layer high.

Examples of the oxidizing gas may include the O-containing gases exemplified above, in addition to the $O_2$ gas. In the process of supplying the oxidizing gas performed under the non-plasma atmosphere, examples of the oxidizing gas may include, ozone ($O_3$) gas, hydrogen peroxide ($H_2O_2$) gas and vapor ($H_2O$ gas) and the like, in addition to the above-described O-containing gas.

While it has been described as an example in the above-described embodiments and the like that the SiCN film, the SiOC film or the SiOCN film is formed as a thin film, a multi-layered film having thin films containing different compositions or elements stacked in a plural number may be formed. For example, in this case, a film may be formed using both a nitriding gas and an oxidizing gas as the modifying gases.

An example of this sequence may include an example in which a multi-layered film is formed on a wafer 200 by performing a cycle a predetermined number of times, the cycle including: a process of performing a set a predetermined number of times, the set including an act of supplying a precursor gas to the wafer 200 and an act of supplying a first modifying gas containing a first element, which is any one of N and O, to the wafer 200 (Set 1); and a process of performing a set a predetermined number of times, the set including an act of supplying the precursor gas to the wafer 200 and an act of supplying a second modifying gas containing a second element, which is the other one of N and O, to the wafer 200 (Set 2).

Each of the sets and the cycle may be performed one or more times, i.e., a predetermined number of times. In addition, any one of Sets 1 and 2 may be first initiated. By performing the cycle including Sets 1 and 2 once, a multi-layered film having a film or layer containing Si, C and the first element (hereinafter, also referred to as a first thin film) formed by Set 1 and a film or layer containing Si, C and the second element (hereinafter, also referred to as a second thin film) formed by Set 2 stacked (i.e., a stacked film) may be formed. In addition, by performing the cycle including Sets 1 and 2 a plurality number of times, a multi-layered film having a plurality of the first thin films and a plurality of the second thin films laminated (i.e., a laminated film) may be formed.

Here, for example, examples of the precursor gas may include BTCSM gas, BTCSE gas, TCDMDS gas, DCTMDS gas, MCPMDS gas, and the like. Further, in Set 1, any ones of the various types of nitriding gases and oxidizing gases exemplified above, for example, the nitriding gases, may be used as the first modifying gas. In Set 2, the other ones of the various types of nitriding gases and oxidizing gases exemplified above, for example, the oxidizing gases, may be used as the second modifying gas.

Figure 9A:
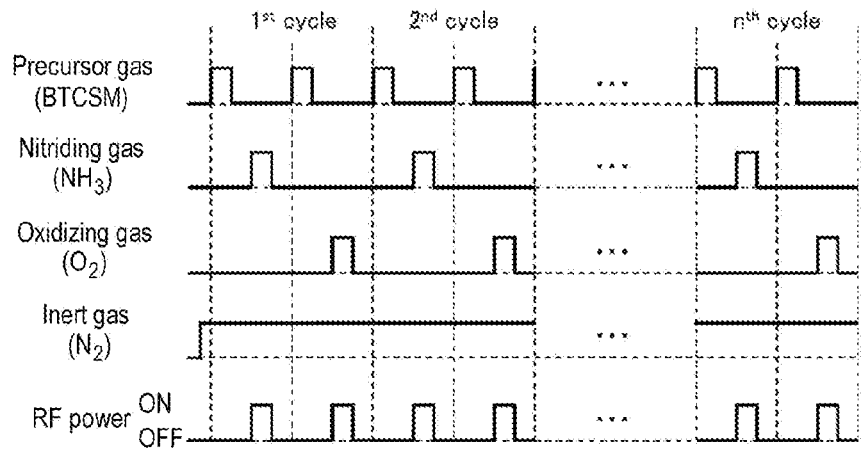
FIGS. 9A to 9C are views illustrating gas supply and RF power supply timings in film forming sequences according to still other embodiments.

FIG. 9A shows an example of a film forming sequence where the precursor gas is, for example, a BTCSM gas. In the film forming sequence of FIG. 9A, an SiCN layer is formed by performing Set 1 and an SiOC layer is formed by performing Set 2. In the film forming sequence of FIG. 9A, a cycle in which Sets 1 and 2 are alternately performed is also repeated a plurality number of times, thereby forming a multi-layered film of the SiCN layers and the SiOC layers. As this multi-layered film is formed as a thin film, a thin film having more various compositions can be obtained and the composition controllability of such a thin film can also be more improved. For example, the SiCN layer has a better resistance to ashing using $O_2$ plasma or the like than the SiOC layer. In addition, as described above, the SiOC layer has a lower dielectric constant than the SiCN layer. As the multi-layered film of the SiCN layer having a better resistance to ashing than the SiOC layer and the SiOC layer having a lower dielectric constant than the SiCN layer is formed, the multi-layered film, for example, having properties of the SiCN layer and properties of the SiOC layer complementing each other, may be formed. Further, it is easy to control film properties such as resistance to ashing or dielectric constant by changing a ratio of the number of the stacked SiCN layers to the number of the stacked SiOC layers.

The reason that the SiCN layer has a better resistance to ashing than the SiOC layer is as follows. In the SiOC layer, the oxidation of the SiOC layer further progresses due to the strong oxidizing power of the $O_2$ plasma or the like, and thus, C bonded with O becomes CO gas or $CO_2$ gas to be easily desorbed from the SiOC layer. Contrarily, since it is relatively difficult for C to be desorbed from the film in the SiCN layer, the concentration of C in the SiCN layer is easily maintained. Therefore, it is also easier to maintain etching resistance after ashing in the SiCN layer than the SiOC layer.

In addition, the multi-layered film of the SiCN and SiOC layers may be referred to as an SiOCN film consisting of the SiOC and SiCN layers alternately stacked. The SiOCN film may be referred to as an SiOC film doped with N (or having N added). In this way, the SiOCN film may be referred to as a thin film having an ashing resistance more improved than the SiOC film by introducing a new element such as N into the SiOC film.

Further, Set 1 may further include the process of supplying the second modifying gas to the wafer 200 such that the first thin film contains N and O together. Furthermore, Set 2 may further include the process of supplying the first modifying gas to the wafer 200 such that the second thin film contains N and O together.

Figure 9B:
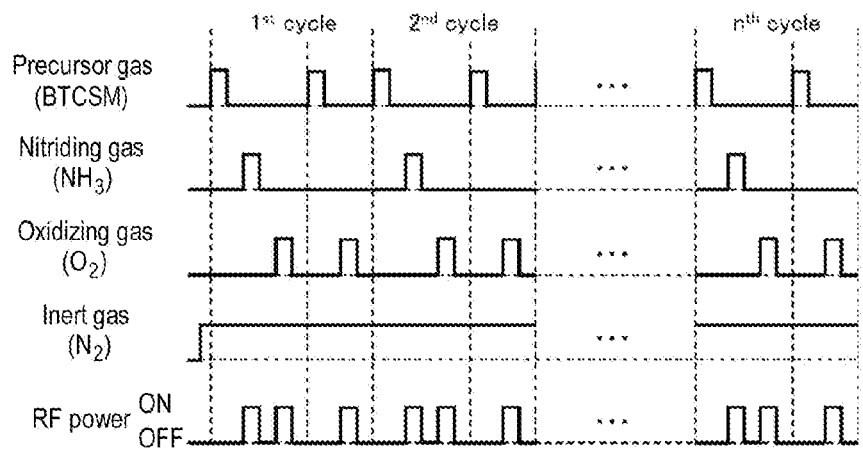

FIG. 9B shows an example of a film forming sequence in which Set 1 further includes the process of supplying the second modifying gas to the wafer 200. In the film forming sequence of FIG. 9B, an SiOCN layer is formed by performing Set 1, and an SiOC layer is formed by performing Set 2. Also, in the film forming sequence of FIG. 9B, a cycle in which Sets 1 and 2 are alternately performed is repeated a plurality number of times, thereby forming a multi-layered film of the SiOCN layer and the SiOC layer. Such a multi-layered film may be referred to as an SiOCN film consisting of the SiOCN and SiOC layers alternately stacked. In addition, when Set 2 further includes the process of supplying the first modifying gas to the wafer 200, a multi-layered film of SiCN and SiOCN layers respectively formed by Sets 1 and 2, i.e., an SiOCN layer consisting of the SiCN and SiOCN layers alternately stacked, is formed. By forming a multi-layered film of a plurality of layers having various different properties, such as the multi-layered film of the SiOCN layer having better ashing resistance than the SiOC layer and the SiOC layer having a lower dielectric constant than the SiOCN layer, the multi-layered film having properties of respective layers complementing each other, such as further improvement of an ashing resistance or further reduction a dielectric constant, may be formed, so that controllability of various properties in the thin film can be more improved.

Further, in the film forming process performed using the nitriding gas and the oxidizing gas as the modifying gases together, the precursor gas and the modifying gas may be simultaneously supplied in the same manner as the modification of the above-described first embodiment.

In a cycle of this case, the process of supplying the precursor gas is performed a predetermined number of times while the process of supplying the nitriding gas as the first modifying gas is performed, and the process of supplying the precursor gas is performed a predetermined number of times while the process of supplying the oxidizing gas as the second modifying gas is performed.

In addition, a multi-layered film having thin films containing different compositions or elements stacked in a plural number may be formed using double silicon sources or double carbon sources by two or more types of precursor gases.

For example, this sequence may include an example in which a multi-layered film is formed on a wafer 200 by performing a cycle a predetermined number of times, the cycle including: a process of performing a set a predetermined number of times, the set including an act of supplying a precursor gas and an act of supplying a modifying gas (Set 1); and a process of performing a set a predetermined number of times, the set including an act of supplying another precursor gas different from the above precursor gas in molecular structure and an act of supplying a modifying gas (Set 2).

Here, for example, a predetermined gas among the BTCSM gas, the BTCSE gas, the TCDMDS gas, the DCTMDS gas, the MCPMDS gas and the like may be used as the precursor gas in Set 1. In addition, for example, a precursor gas, which makes a combination with the above predetermined gas to have different molecular structures, among the BTCSM gas, the BTCSE gas, the TCDMDS gas, the DCTMDS gas, the MCPMDS gas, the HCDS gas, the TCS gas, the STC gas, the DCS gas, the MCS gas and the like may be used as the precursor gas in Set 2. The modifying gas in Set 2 may be a gas containing the same element as the modifying gas in Set 1 or a gas containing a different element therefrom. All of gases having different elements from one another may be used in Set 1, and all gases having different elements from one another may be used in Set 2.

Figure 9C:
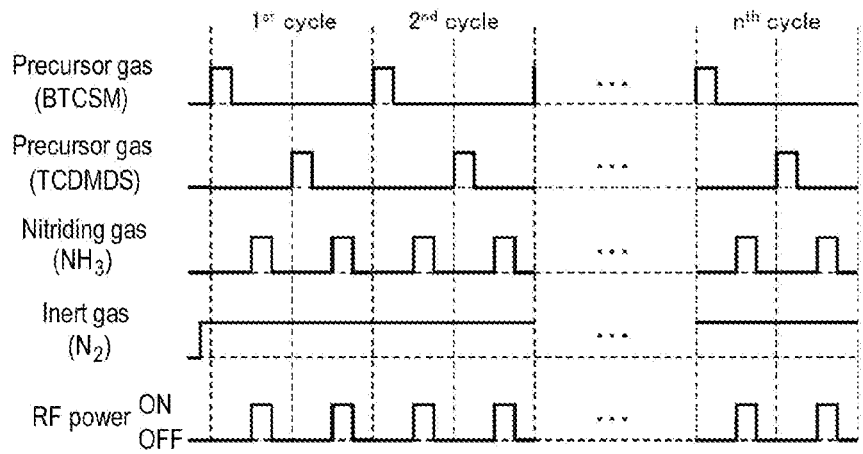

FIG. 9C shows an example of the film forming sequence in which a BTCSM gas and a TCDMDS gas are used as the precursor gases in Sets 1 and 2, respectively, and an $NH_3$ gas is used as the modifying gas in both Sets 1 and 2. In the film forming sequence of FIG. 9C, an SiCN layer originated from the BTCSM gas is formed in Set 1, and an SiCN layer originated from the TCDMDS gas is formed in Set 2. These SiCN layers are formed from the precursor gases respectively having different reactivities and have different composition ratios, i.e., different ratios of an Si concentration, a C concentration, an N concentration and the like. In the film forming sequence of FIG. 9C, a multi-layered film of the SiCN layers is formed by repeating the cycle a plurality number of times, the cycle having Steps 1 and 2 alternately performed. Such a multi-layered film may be referred to as an SiCN film consisting of the SiCN layers having different composition ratios stacked. In this way, it is easy to more accurately control a ratio of respective components of the thin film using the two or more types of precursor gases.

Further, the film forming process performed using the two or more types of precursor gases may be performed by simultaneously supplying the precursor gas and the modifying gas in the same manner as the above-described modifications of the first embodiment.

In a cycle of this case, the process of supplying the precursor gas is performed a predetermined number of times while the process of supplying the modifying gas is performed, and the process of supplying another precursor gas having a different molecular structure from the above precursor gas is performed a predetermined number of times while the process of supplying the modifying gas.

Further, in FIGS. 9A to 9C described above, the process of supplying each gas may be performed under the same conditions as the above-described embodiments or modifications. The film forming sequence may be performed under a non-plasma atmosphere.

However, in an existing SRAM, an off leakage current of a transistor flows with voltage applied to a device even in a standby state. In DRAM that is a volatile memory like SRAM, refresh operation needs to be performed in order to maintain data. Since the number of bits mounted in a memory device constituting a cash memory of LSI is gradually increased along with a high density integration of semiconductor devices, it is apprehended that power consumption due to these is increased. In addition, there is also an issue in forming a memory device, such as the limitation of miniaturization of a transistor or high dielectric constant of a capacitor material.

In order to reduce the power consumption, a nonvolatile memory may be used in that the nonvolatile memory does not need power for maintaining data in a standby state. As a memory device that is substituted for SRAM or DRAM, MRAM or STT-MRAM, in which a magnetic field is vertically oriented in MRAM in an STT method, has been developed. Also, in a NAND flash memory used in data storage, an adverse effect of interference between adjacent devices comes to the fore, so that a 3D structure configured to secure a distance between adjacent devices by stacking the devices in the vertical direction, or RRAM as a next generation memory technique substituted for this has been developed. In the next generation memory such as STT-MRAM or RRAM, while a development of a memory device main body, such as application of a magnetic material or a resistance varying material, goes along, a film having high insulating properties, which can be formed at, for example, 350 degrees C. or less, is required in terms of suppression of device property deterioration even for a cover film configured to cover a memory device.

As in the above-described respective embodiments or modifications, the thin film having a low dielectric constant and high insulating properties, which is formed at a medium degree of temperature under a non-plasma atmosphere or at a lower temperature under a plasma atmosphere, is appropriately used in a surrounding structure of this memory device.

Specifically, as the thin film formed according to the method of the above-described respective embodiments and modifications may be used as an SWS, a device forming technique having a small leak current and good machinability can be provided.

In addition, as the thin film formed according to the method of the above-described respective embodiments and modifications may be used as an etching stopper, a device forming technique having good machinability can be provided.

In addition, according to the method of the above-described respective embodiments and modifications, for example, since the thin film can be formed without using plasma, application to a process having probability of plasma damage, for example, an SADP film of DPT, is also possible.

In addition, a plurality of process recipes (e.g., programs describing processing procedures or processing conditions written) used in forming a variety of the thin films may be individually prepared according to substrate processing types (e.g., the type of film to be formed, a composition ratio, a film quality, a film thickness and the like). In addition, when the substrate processing is initiated, a suitable process recipe is appropriately selected among the plurality of process recipes according to a substrate processing type. Specifically, the plurality of process recipes individually prepared according to substrate processing types may be previously stored (or installed) in the memory device 121c provided in the substrate processing apparatus through an electrical communication line or a recording medium (e.g., the external memory device 123) storing the process recipes. In addition, when the substrate processing is initiated, the CPU 121a provided in the substrate processing apparatus appropriately may select a suitable process recipe among the plurality of process recipes stored in the memory device 121c according to a substrate processing type. With this configuration, thin films having a variety of film types, composition ratios, film qualities and film thicknesses can be formed with high versatility and high reproducibility in one substrate processing apparatus. In addition, this configuration can reduce an operator's work load (e.g., a load of inputting processing procedures or processing conditions, or the like), thereby rapidly initiating the substrate processing while avoiding an operational error.

The above-described process recipe is not limited to a newly prepared recipe and may be prepared, for example, by modifying an existing process recipe that is already installed in the substrate processing apparatus. When the process recipe is modified, the modified process recipe may be installed to the substrate processing apparatus through an electrical communication line or a recording medium storing the process recipe. In addition, the process recipe previously installed in the existing substrate processing apparatus may be directly changed by manipulating the input/output device 122 of the substrate processing apparatus.

In the film forming sequence according to the above-described embodiments and the like, an example in which the various thin films are formed at room temperature has also been described. However, the inside of the process chamber 201 may not be heated by the heater 207, and the substrate processing apparatus may not be provided with the heater. In such a case, the configuration of the heating system of the substrate processing apparatus can be simplified, so that the substrate processing apparatus may have further simple configuration with less expenses.

While it has been described as an example in the above-described embodiments and the like that a thin film is formed using a batch type substrate processing apparatus in which a plurality of substrates are processed at a time, the present disclosure is not limited thereto but may be applied to a case in which a thin film is formed using a single-wafer type substrate processing apparatus in which one or several substrates are processed at a time. Although it has been described as an example in the above-described embodiments that the substrate processing apparatus having the hot wall type processing furnace is used to form the thin film, the present disclosure is not limited thereto but may be appropriately applied to a case in which a substrate processing apparatus having a cold wall type processing furnace is used to form the thin film.

The above-described embodiments and modifications may be appropriately combined and used.

<Aspects of the Present Disclosure>

Hereinafter, the some aspects of the present disclosure will be additionally stated.

(Supplementary Note 1)

According to an aspect of the present disclosure, there is provided a method of manufacturing a semiconductor device, the method including forming a film containing silicon, carbon and a predetermined element on a substrate by performing a cycle a first predetermined number of times, the predetermined element being one of nitrogen and oxygen, the cycle including: supplying a first precursor gas containing at least two silicon atoms per one molecule, carbon and a halogen element and having an Si—C bonding to the substrate; and supplying a modifying gas containing the predetermined element to the substrate.

(Supplementary Note 2)

In the method of manufacturing a semiconductor device according to Supplementary Note 1, supplying the modifying gas includes supplying a first modifying gas containing one of nitrogen and oxygen to the substrate, the cycle further includes supplying a second modifying gas containing one of nitrogen and oxygen that is not contained in the first modifying gas to the substrate, and the film contains silicon, carbon, nitrogen and oxygen.

(Supplementary Note 3)

In the method of manufacturing a semiconductor device according to Supplementary Note 2, in the act of forming the film, the cycle includes: supplying the first precursor gas; supplying the first modifying gas; and supplying the second modifying gas is performed the first predetermined number of times.

(Supplementary Note 4)

In the method of manufacturing a semiconductor device according to Supplementary Note 2, the cycle further includes performing a first set a second predetermined number of times, the first set including supplying the first precursor gas and supplying the first modifying gas; and performing a second set a third predetermined number of times, the second set including supplying the first precursor gas and supplying the second modifying gas.

(Supplementary Note 5)

In the method of manufacturing a semiconductor device according to Supplementary Note 2, the cycle further includes performing a first set a second predetermined number of times, the first set including supplying the first precursor gas, supplying the first modifying gas, and supplying the second modifying gas; and performing a second set a third predetermined number of times, the second set including supplying the first precursor gas and supplying the second modifying gas.

(Supplementary Note 6)

In the method of manufacturing a semiconductor device according to Supplementary Note 2, the cycle further includes performing a first set a second predetermined number of times, the first set including supplying the first precursor gas and supplying the first modifying gas; and performing a second set a third predetermined number of times, the second set including supplying the first precursor gas, supplying the first modifying gas, and supplying the second modifying gas.

(Supplementary Note 7)

In the method of manufacturing a semiconductor device according to any one of Supplementary Notes 1 to 3, the cycle further includes supplying a second precursor gas containing at least silicon and a halogen element to the substrate, the second precursor gas having a molecular structure different from a molecular structure of the first precursor gas.

(Supplementary Note 8)

In the method of manufacturing a semiconductor device according to any one of Supplementary Notes 1 to 3, the cycle further includes supplying a second precursor gas containing at least two silicon atoms per one molecule, carbon and a halogen element and having an Si—C bonding to the substrate, the second precursor gas having a molecular structure different from a molecular structure of the first precursor gas.

(Supplementary Note 9)

In the method of manufacturing a semiconductor device according to Supplementary Note 7 or 8, the cycle further includes performing a set a second predetermined number of times, the set including supplying the first precursor gas and supplying the second precursor gas; and supplying the modifying gas.

(Supplementary Note 10)

In the method of manufacturing a semiconductor device according to Supplementary Note 7 or 8, the cycle further includes performing a first set a second predetermined number of times, the first set including supplying the first precursor gas and supplying the modifying gas; and performing a second set a third predetermined number of times, the second set including supplying the second precursor gas and supplying the modifying gas.

(Supplementary Note 11)

In the method of manufacturing a semiconductor device according to Supplementary Note 7 or 8, the cycle further includes: performing a first set a second predetermined number of times, the first set including supplying the first precursor gas and supplying a first modifying gas containing one of nitrogen and oxygen to the substrate; and performing a second set a third predetermined number of times, the second set including supplying the second precursor gas and supplying a second modifying gas containing one of nitrogen and oxygen that is not contained in the first modifying gas to the substrate.

(Supplementary Note 12)

In the method of manufacturing a semiconductor device according to Supplementary Note 7 or 8, the cycle further includes: performing a first set a second predetermined number of times, the first set including supplying the first precursor gas, supplying a first modifying gas containing one of nitrogen and oxygen to the substrate, and supplying a second modifying gas containing one of nitrogen and oxygen that is not contained in the first modifying gas to the substrate; and performing a second set a third predetermined number of times, the second set including supplying the second precursor gas and supplying the second modifying gas.

(Supplementary Note 13)

In the method of manufacturing a semiconductor device according to Supplementary Note 7 or 8, the cycle further includes: performing a first set a second predetermined number of times, the first set including supplying the first precursor gas and supplying a first modifying gas containing one of nitrogen and oxygen to the substrate; and performing a second set a third predetermined number of times, the second set including supplying the second precursor gas, supplying the first modifying gas, and supplying a second modifying gas containing one of nitrogen and oxygen that is not contained in the first modifying gas to the substrate.

(Supplementary Note 14)

In the method of manufacturing a semiconductor device according to Supplementary Note 1, supplying the first precursor gas is performed a second predetermined number of times in a period in which the modifying gas is supplied.

(Supplementary Note 15)

In the method of manufacturing a semiconductor device according to Supplementary Note 2, supplying the first precursor gas is performed a second predetermined number of times in a period in which the first modifying gas is supplied, and supplying the first precursor gas is performed a third predetermined number of times in a period in which the second modifying gas is supplied.

(Supplementary Note 16)

In the method of manufacturing a semiconductor device according to Supplementary Note 7 or 8, supplying the first precursor gas is performed a second predetermined number of times in a period in which the modifying gas is supplied, and supplying the second precursor gas is performed a third predetermined number of times in a period in which the modifying gas is supplied.

(Supplementary Note 17)

According to another aspect of the present disclosure, there is provided a method of manufacturing a semiconductor device, including: forming a film containing silicon, carbon, nitrogen, and oxygen on a substrate by performing a cycle a predetermined number of times, the cycle including: supplying a precursor gas containing at least two silicon atoms per one molecule, carbon and a halogen element and having an Si—C bonding to the substrate; supplying a first modifying gas containing one of nitrogen and oxygen to the substrate; and a second modifying gas containing one of nitrogen and oxygen that is not contained in the first modifying gas to the substrate.

(Supplementary Note 18)

According to still another aspect of the present disclosure, there is provided a method of manufacturing a semiconductor device, including: forming a multi-layered film of a first and a second films on a substrate by performing a cycle a first predetermined number of times, the cycle including: forming the first film containing silicon, carbon and a first element by performing a first set a second predetermined number of times; and forming the second film containing silicon, carbon and a second element by performing a second set a third predetermined number of times, the first set including supplying a first precursor gas containing at least two silicon atoms per one molecule, carbon and a halogen element and having an Si—C bonding to the substrate and supplying a first modifying gas containing the first element to the substrate, the first element being one of nitrogen and oxygen, the second set including supplying a second precursor gas containing at least two silicon atoms per one molecule, carbon and a halogen element and having an Si—C bonding to the substrate and supplying a second modifying gas containing the second element to the substrate, the second element being one of nitrogen and oxygen that is not contained in the first modifying gas.

(Supplementary Note 19)

In the method of manufacturing a semiconductor device according to Supplementary Note 18, forming the first film further includes supplying the second modifying gas to the substrate, and the first film formed in the act of forming the first film contains silicon, carbon, the first element and the second element.

(Supplementary Note 20)

In the method of manufacturing a semiconductor device according to Supplementary Note 18, forming the second film further includes supplying the first modifying gas to the substrate, and the second film formed in the act of forming the second film contains silicon, carbon, the first element and the second element.

(Supplementary Note 21)

According to still another aspect of the present disclosure, there is provided a method of processing a substrate, including forming a film containing silicon, carbon and a predetermined element on the substrate by performing a cycle a predetermined number of times, the predetermined element being one of nitrogen and oxygen, the cycle including: supplying a precursor gas containing at least two silicon atoms per one molecule, carbon and a halogen element and having an Si—C bonding to the substrate; and supplying a modifying gas containing the predetermined element to the substrate.

(Supplementary Note 22)

According to still another aspect of the present disclosure, there is provided a substrate processing apparatus, including: a process chamber configured to accommodate a substrate; a precursor gas supply system configured to supply a precursor gas containing at least two silicon atoms per one molecule, carbon and a halogen element and having an Si—C bonding into the process chamber; a modifying gas supply system configured to supply a modifying gas containing a predetermined element into the process chamber, the predetermined element being one of nitrogen and oxygen; and a controller configured to control the precursor gas supply system and the modifying gas supply system so as to form a film containing silicon, carbon and the predetermined element on the substrate by performing a cycle a predetermined number of times, the cycle including supplying the precursor gas to the substrate in the process chamber and supplying the modifying gas to the substrate in the process chamber.

(Supplementary Note 23)

According to still another aspect of the present disclosure, there are provided a program and a non-transitory computer-readable recording medium storing the program that causes a computer to perform a process of forming a film containing silicon, carbon and a predetermined element on a substrate in a process chamber of a substrate processing apparatus by performing a cycle a predetermined number of times, the predetermined element being one of nitrogen and oxygen, the cycle including: supplying a precursor gas containing at least two silicon atoms per one molecule, carbon and a halogen element and having an Si—C bonding to the substrate in the process chamber; and supplying a modifying gas containing the predetermined element to the substrate in the process chamber.

According to the present disclosure in some embodiments, a film containing carbon at a high concentration can be formed with high controllability.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, the method comprising forming a film containing silicon, carbon and a predetermined element on a substrate by performing a cycle a first predetermined number of times, the predetermined element being one of nitrogen and oxygen, the cycle comprising:
   supplying a first precursor gas containing at least two silicon atoms per one molecule, carbon and a halogen element and having an Si—C bonding to the substrate; and
   supplying a modifying gas containing the predetermined element to the substrate, the modifying gas being thermally activated,
   wherein supplying the modifying gas is initiated before supplying the first precursor gas is initiated, and supplying the modifying gas is stopped after supplying the first precursor gas is stopped,
   wherein the act of supplying the first precursor gas and the act of supplying the modifying gas are performed under a non-plasma atmosphere.

2. The method of claim 1, wherein supplying the modifying gas includes supplying a first modifying gas containing one of nitrogen and oxygen to the substrate,
   wherein the cycle further comprises supplying a second modifying gas containing one of nitrogen and oxygen that is not contained in the first modifying gas to the substrate, and
   wherein the film contains silicon, carbon, nitrogen and oxygen.

3. The method of claim 2, wherein, in the act of forming the film, the cycle comprising: supplying the first precursor gas; supplying the first modifying gas; and supplying the second modifying gas is performed the first predetermined number of times.

4. The method of claim 2, wherein the cycle further comprises:
   performing a first set a second predetermined number of times, the first set including supplying the first precursor gas and supplying the first modifying gas; and
   performing a second set a third predetermined number of times, the second set including supplying the first precursor gas and supplying the second modifying gas.

5. The method of claim 2, wherein the cycle further comprises:
   performing a first set a second predetermined number of times, the first set including supplying the first precursor gas, supplying the first modifying gas, and supplying the second modifying gas; and
   performing a second set a third predetermined number of times, the second set including supplying the first precursor gas and supplying the second modifying gas.

6. The method of claim 2, wherein the cycle further comprises:
   performing a first set a second predetermined number of times, the first set including supplying the first precursor gas and supplying the first modifying gas; and
   performing a second set a third predetermined number of times, the second set including supplying the first precursor gas, supplying the first modifying gas, and supplying the second modifying gas.

7. The method of claim 1, wherein the cycle further comprises supplying a second precursor gas containing at least silicon and a halogen element to the substrate, the second precursor gas having a molecular structure different from a molecular structure of the first precursor gas.

8. The method of claim 1, wherein the cycle further comprises supplying a second precursor gas containing at least two silicon atoms per one molecule, carbon and a halogen element and having an Si—C bonding to the substrate, the second precursor gas having a molecular structure different from a molecular structure of the first precursor gas.

9. The method of claim 7, wherein the cycle further comprises:
performing a set a second predetermined number of times, the set including supplying the first precursor gas and supplying the second precursor gas; and
supplying the modifying gas.

10. The method of claim 7, wherein the cycle further comprises:
performing a first set a second predetermined number of times, the first set including supplying the first precursor gas and supplying the modifying gas; and
performing a second set a third predetermined number of times, the second set including supplying the second precursor gas and supplying the modifying gas.

11. The method of claim 7, wherein the cycle further comprises:
performing a first set a second predetermined number of times, the first set including supplying the first precursor gas and supplying a first modifying gas containing one of nitrogen and oxygen to the substrate; and
performing a second set a third predetermined number of times, the second set including supplying the second precursor gas and supplying a second modifying gas containing one of nitrogen and oxygen that is not contained in the first modifying gas to the substrate.

12. The method of claim 7, wherein the cycle further comprises:
performing a first set a second predetermined number of times, the first set including supplying the first precursor gas, supplying a first modifying gas containing one of nitrogen and oxygen to the substrate, and supplying a second modifying gas containing one of nitrogen and oxygen that is not contained in the first modifying gas to the substrate; and
performing a second set a third predetermined number of times, the second set including supplying the second precursor gas and supplying the second modifying gas.

13. The method of claim 7, wherein the cycle further comprises:
performing a first set a second predetermined number of times, the first set including supplying the first precursor gas and supplying a first modifying gas containing one of nitrogen and oxygen to the substrate; and
performing a second set a third predetermined number of times, the second set including supplying the second precursor gas, supplying the first modifying gas, and supplying a second modifying gas containing one of nitrogen and oxygen that is not contained in the first modifying gas to the substrate.

14. The method of claim 1, wherein supplying the first precursor gas is performed a second predetermined number of times in a period in which the modifying gas is supplied.

15. The method of claim 2, wherein supplying the first precursor gas is performed a second predetermined number of times in a period in which the first modifying gas is supplied, and
wherein supplying the first precursor gas is performed a third predetermined number of times in a period in which the second modifying gas is supplied.

16. The method of claim 7, wherein supplying the first precursor gas is performed a second predetermined number of times in a period in which the modifying gas is supplied, and
wherein supplying the second precursor gas is performed a third predetermined number of times in a period in which the modifying gas is supplied.

* * * * *